(12) United States Patent
Alidio et al.

(10) Patent No.: US 9,503,075 B2
(45) Date of Patent: Nov. 22, 2016

(54) DELAY LINE SYSTEM AND SWITCHING APPARATUS WITH EMBEDDED ATTENUATORS

(71) Applicant: Peregrine Semiconductor Corporation, San Diego, CA (US)

(72) Inventors: Raul Inocencio Alidio, Carlsbad, CA (US); Peter Bacon, Derry, NH (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

(21) Appl. No.: 14/709,000

(22) Filed: May 11, 2015

(65) Prior Publication Data

US 2016/0020756 A1 Jan. 21, 2016

Related U.S. Application Data

(60) Provisional application No. 61/994,751, filed on May 16, 2014.

(51) Int. Cl.
*H03K 17/28* (2006.01)
*H03K 17/284* (2006.01)
*H03K 5/13* (2014.01)

(52) U.S. Cl.
CPC .............. *H03K 17/28* (2013.01); *H03K 5/133* (2013.01); *H03K 17/284* (2013.01)

(58) Field of Classification Search
CPC ...... H03K 5/133; H03K 5/134; H03K 17/28; H03K 17/284
USPC ....... 327/261, 276, 277, 278, 281, 283, 284, 327/285, 288, 290, 392, 398, 399, 400, 401, 327/415, 416
See application file for complete search history.

(56) References Cited

U.S. PATENT DOCUMENTS

| | | | |
|---|---|---|---|
| 6,804,502 B2 | 10/2004 | Burgener et al. | |
| 6,867,635 B2 * | 3/2005 | Westerman | H03K 17/693 327/416 |
| 7,248,120 B2 | 7/2007 | Burgener et al. | |
| 7,910,993 B2 | 3/2011 | Brindle et al. | |
| 2005/0179469 A1* | 8/2005 | Kasanyal | H03K 5/133 327/65 |
| 2009/0160784 A1* | 6/2009 | Ishida | G06F 1/1616 345/173 |
| 2011/0181333 A1* | 7/2011 | Ramaraju | H03H 11/26 327/272 |

* cited by examiner

*Primary Examiner* — William Hernandez
(74) *Attorney, Agent, or Firm* — Jaquez Land Greenhaus LLP; Martin J. Jaquez, Esq.; Alessandro Steinfl, Esq.

(57) ABSTRACT

A monolithically integrated switch configured to operate at an input signal frequency ranging from 0 Hz to 80 GHz. The switch has an input port and two output ports. A first conduction path is provided from the input port to the first output port. A second conduction path is provided from the input port to the second output port. In addition, a first shunting path is provided between the first output port and a reference and a second shunting path is provided between the second output and the reference. In a first mode, the first conduction path and the second shunting path have a low impedance. The second conduction path and the first shunting path have a high impedance. In a second mode, the first conduction path and the second shunting path have a high impedance. The second conduction path and the first shunting path have a low impedance.

35 Claims, 10 Drawing Sheets

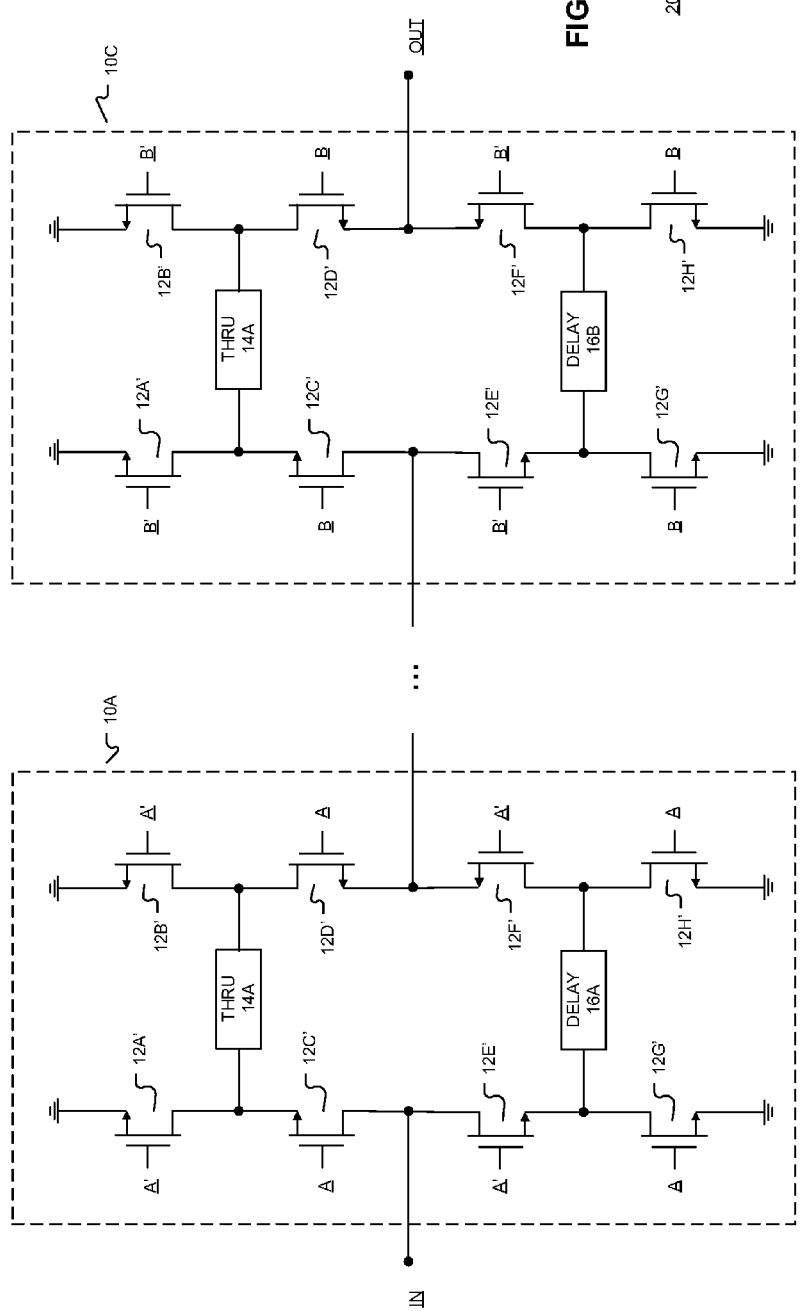
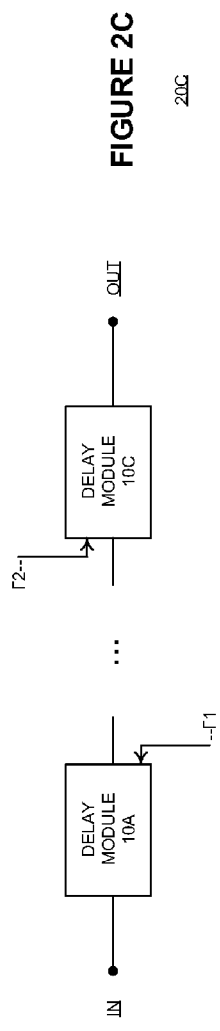
FIGURE 1D
FIGURE 2C

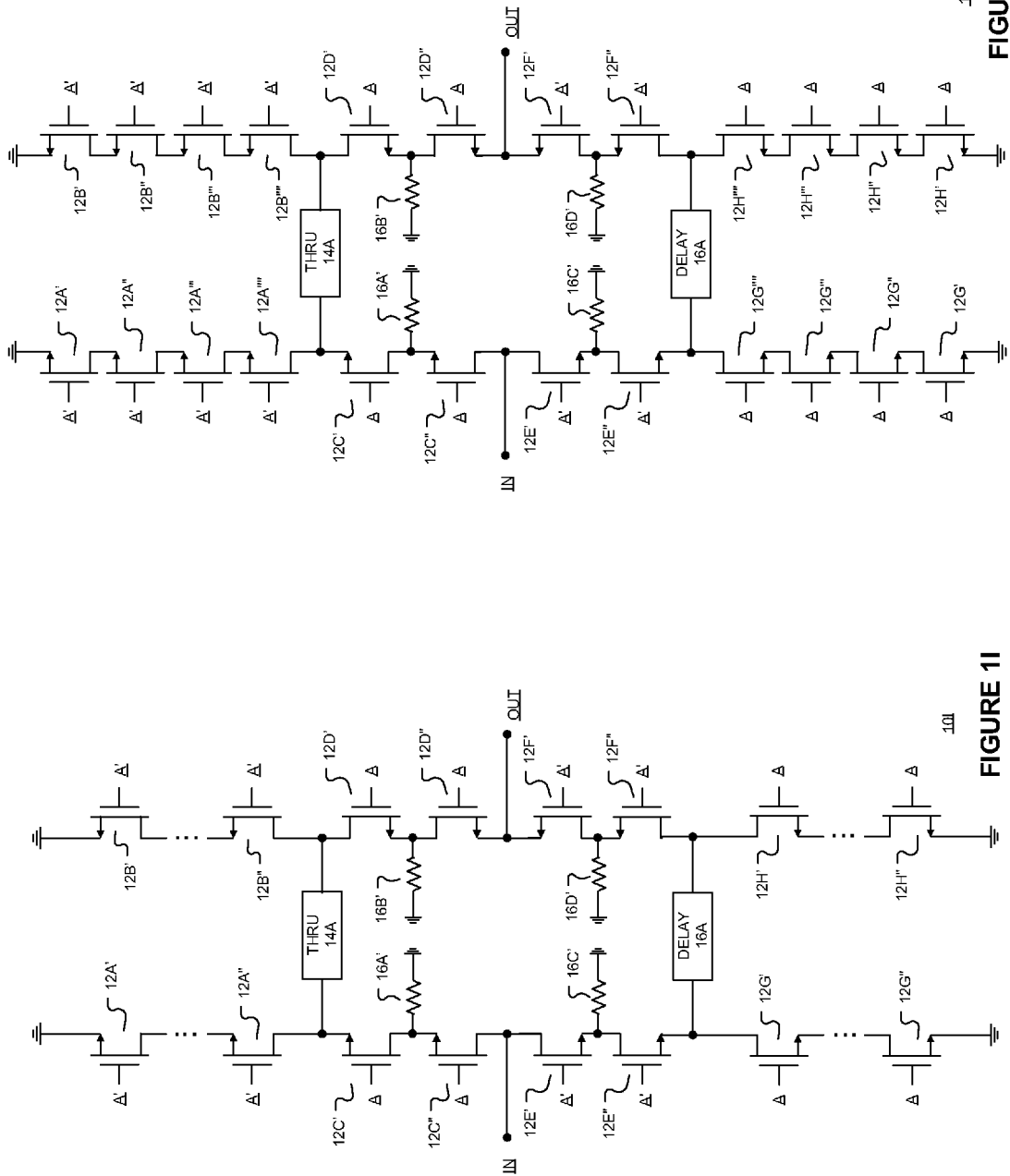

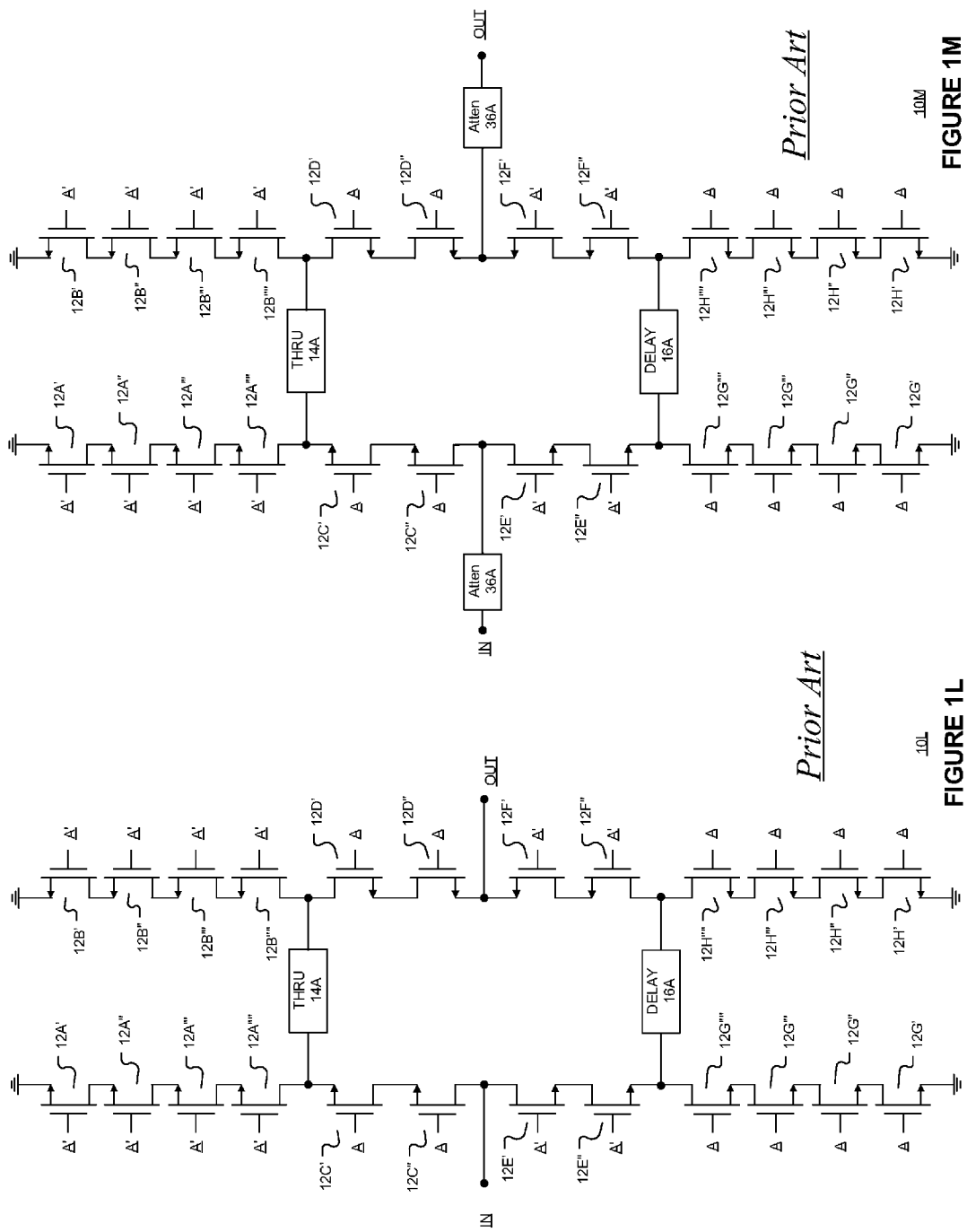

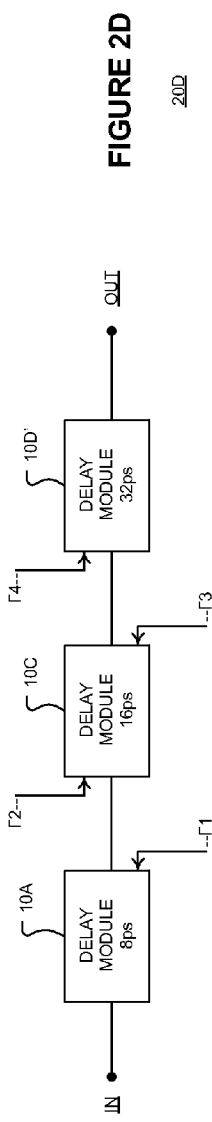
FIGURE 2D
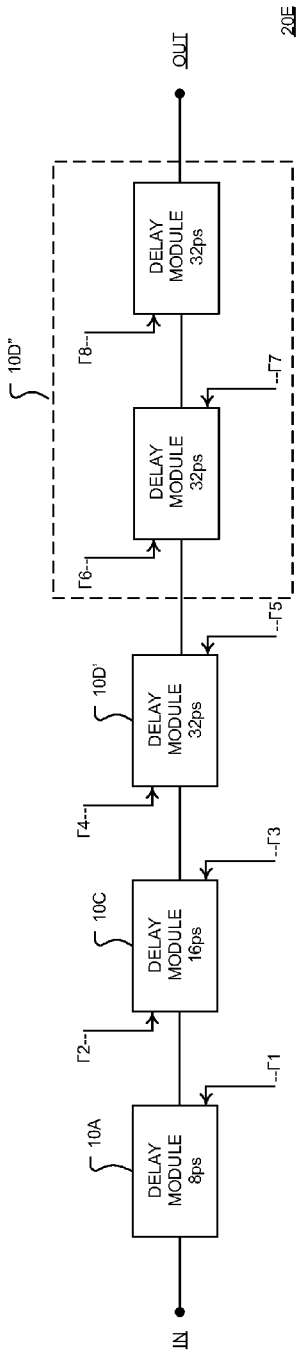
FIGURE 2E
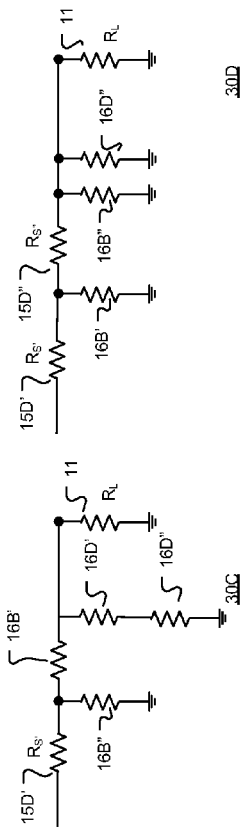
FIGURE 3D
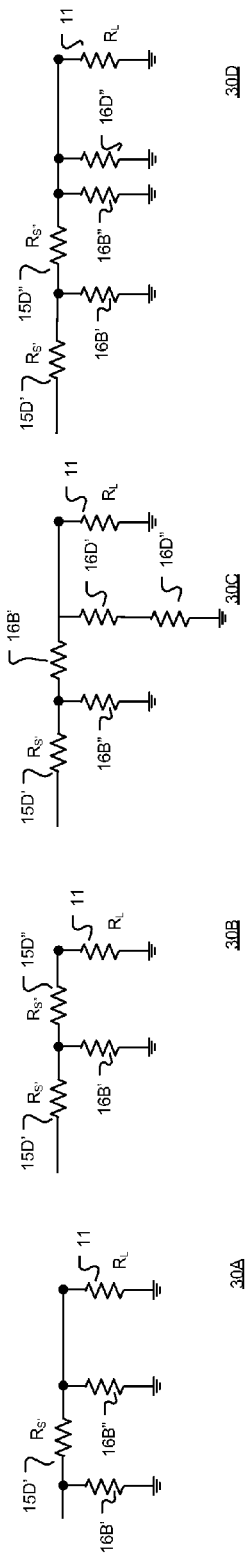
FIGURE 3C
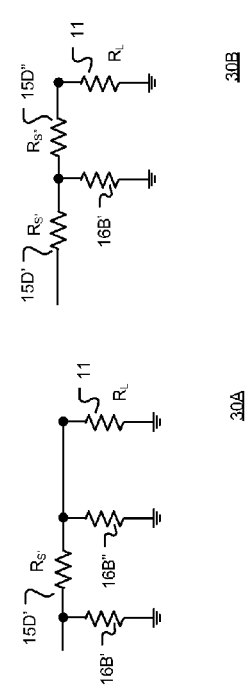
FIGURE 3B
FIGURE 3A

DELAY LINE SYSTEM AND SWITCHING APPARATUS WITH EMBEDDED ATTENUATORS

CROSS REFERENCE TO RELATED APPLICATIONS

The present application claims priority to U.S. provisional Patent Application Ser. No. 61/994,751, filed on May 16, 2014, for a "Delay Line System and Switching Apparatus with Embedded Attenuators", which is herein incorporated by reference in its entirety.

The present application may be related to U.S. Pat. No. 6,804,502, issued on Oct. 12, 2004 and entitled "Switch Circuit and Method of Switching Radio Frequency Signals", the disclosure of which is incorporated herein by reference in its entirety. The present application may also be related to U.S. Pat. No. 7,910,993, issued on Mar. 22, 2011 and entitled "Method and Apparatus for use in Improving Linearity of MOSFET's using an Accumulated Charge Sink", the disclosure of which is incorporated herein by reference in its entirety. The present application may also be related to U.S. Pat. No. 7,248,120, issued on Jul. 24, 2007, entitled "Stacked Transistor Method and Apparatus", the disclosure of which is incorporated herein by reference in its entirety.

BACKGROUND

1. Field

Various embodiments described herein relate generally to delay line architectures including two or more delay line modules. Each delay line module may include semiconductor switches to direct a signal on a thru, non-delayed path, and a delayed path. The semiconductor switches may include various semiconductors including metal-oxide semiconductor field effect transistors (MOSFET), metal-semiconductor field effect transistors (MESFET), bipolar junction transistors (BJT), P-N diodes, PIN diodes, and other semiconductor constructs. In an embodiment, the semiconductor switches may be fabricated on silicon-on-insulator ("SOI") and silicon-on-sapphire ("SOS") substrates, although other fabrication technologies, such as bulk-silicon and micro-electro-mechanical systems (MEMS) technologies may also be used in other embodiments. Delay line modules may further include embedded attenuators.

2. Description of Related Art

Delay line architectures including multiple delay line modules may experience performance degradation due to linear phase shifts caused by voltage standing wave reflections (VSWR) between the delay line modules. It may be desirable to improve delay line architecture linear phase accuracy by reducing VSWR in the architecture; the present invention provides system, apparatus, and methods for same.

SUMMARY

According to a first aspect of the present disclosure, a monolithically integrated switch configured to operate at an input signal frequency ranging from 0 Hz to 80 GHz is presented, the switch comprising: an input port configured to carry the input signal; a plurality of switches configured to provide a plurality of conduction paths; a first output port and a second output port; a first conduction path of the plurality of conduction paths between the input port and the first output port, the first conduction path comprising a first attenuator block comprising one or more shunting resistors and one or more series connected switches of the plurality of switches; a second conduction path of the plurality of conduction paths between the input port and the second output port; a first shunting path of the plurality of conduction paths between the first output port and a reference potential; a second shunting path of the plurality of conduction paths between the second output port and the reference potential; wherein: a low impedance or high impedance of a conduction path of the plurality of conduction paths is selectively provided by one or more switches of the plurality of switches based on a mode of operation of the switch; during a first mode of operation of the switch, the first conduction path and the second shunting path are low impedance conduction paths, and the second conduction path and the first shunting path are high impedance conduction paths, during a second mode of operation of the switch, the second conduction path and the first shunting path are low impedance conduction paths, and the first conduction path and the second shunting path are high impedance conduction paths, and during the first mode of operation, the first attenuator block is configured to reduce a magnitude of voltage standing wave reflections (VSWR) based on a value of a load impedance coupled to the first output port.

According to second aspect of the present disclosure, a monolithically integrated switch configured to operate at an input signal frequency ranging from 0 Hz to 80 GHz is presented, the switch comprising: an input port configured to carry the input signal; a plurality of switches configured to provide a plurality of conduction paths; a plurality of output ports comprising a first output port, a second output port, . . . , and an nth output port; a first conduction path of the plurality of conduction paths between the input port and the first output port, the first conduction path comprising a first attenuator block comprising one or more shunting resistors and one or more series connected switches of the plurality of switches; a second conduction path of the plurality of conduction paths between the input port and the second output port, the second conduction path comprising a second attenuator block comprising one or more shunting resistors and one or more series connected switches of the plurality of switches; . . . an nth conduction path of the plurality of conduction paths between the input port and the nth output port, the nth conduction path comprising an nth attenuator block comprising one or more shunting resistors and one or more series connected switches of the plurality of switches; a first shunting path of the plurality of conduction paths between the first output port and a reference potential; a second shunting path of the plurality of conduction paths between the second output port and the reference potential; . . . and; an nth shunting path of the plurality of conduction paths between the nth output port and the reference potential; wherein: a low impedance or high impedance of a conduction path of the plurality of conduction paths is selectively provided by one or more switches of the plurality of switches based on a mode i of operation of the switch, where i∈[1, 2, . . . , n]; during the mode i of operation of the switch, the ith conduction path is a low impedance conduction path and all pth conduction paths, with p=[1, 2, . . . , i−1, i+1, . . . , n], are high impedance conduction paths; during the mode i of operation of the switch, the ith shunting path is a high impedance conduction path and all pth shunting paths, with p=[1, 2, . . . , i−1, i+1, . . . , n], are low impedance conduction paths; during the mode i of operation, the ith attenuator block is configured to reduce a magnitude of voltage standing wave reflections (VSWR) based on a value of a load impedance coupled to the ith output port.

According to a third aspect of the present disclosure, a method for reducing input return loss in a monolithically integrated single pole double throw (SPDT) switch operating at an input signal frequency ranging from 0 Hz to 80 GHz is presented, the method comprising: providing in a conduction path between a pole terminal and a first throw terminal of the SPDT integrated switch an attenuator block comprising one or more switches and one or more shunting resistors; based on the providing, selecting a resistance value of the one or more shunting resistors based on an ON resistance of the one or more switches and a desired load impedance at the first throw terminal; based on the selecting, decreasing a series resistance seen at the first throw terminal; and based on the decreasing, reducing the input return loss and thereby reducing a corresponding voltage standing wave reflections (VSWR) at the first throw terminal.

According to a fourth aspect of the present disclosure, a method for increasing delay accuracy in a switched delay line module is presented, the method comprising: providing a first single pole multiple throw (SPMT) switch and a second SPMT switch; coupling a first throw terminal of the first SPMT to a first throw terminal of the second SPMT switch via a first delay module; providing, in a conduction path between a pole terminal of the first SPMT switch and the first throw terminal of the first SPMT switch, a first attenuator block comprising one or more switches and one or more shunting resistors; providing, in a conduction path between a pole terminal of the second SPMT switch and the first throw terminal of the second SPMT switch, a second attenuator block comprising one or more switches and one or more shunting resistors; selecting, for the first attenuator block, a resistance value of the one or more shunting resistors based on an ON resistance of the one or more switches and a load impedance of the first delay module at the first throw terminal; selecting, for the second attenuator block, a resistance value of the one or more shunting resistors based on an ON resistance of the one or more switches and a load impedance of the first delay module at the second throw terminal; based on the selecting for the first and the second attenuator blocks, reduce a linear phase shift of a signal transmitted from the pole terminal of the first SPMT switch to the pole terminal of the second SPMT switch through the first throw terminal of the first SPMT switch, the first delay module and the first throw terminal of the second SPMT switch; and based on the reducing, increasing delay accuracy provided by a conduction path associated to the first delay module of the switched delay line module.

According to a fifth aspect of the present disclosure, a monolithically integrated switch configured to operate at an input signal frequency ranging from 0 Hz to 80 GHz, the switch comprising: an input port configured to carry the input signal; a first output port and a second output port; a first conduction path between the input port and the first output port, comprising: a first group of one or more series connected switches coupled between the input port and the first output port; a first group of one or more shunting resistors coupled between the first group of one or more series connected switches and ground; and a second group of one or more series connected switches coupled between the first output port and ground; a second conduction path between the input port and the second output port, comprising: a third group of one or more series connected switches coupled between the input port and the second output port; a second group of one or more shunting resistors coupled between the third group of one or more series connected switches and ground; and a fourth group of one or more series connected switches coupled between the first output port and ground.

According to a sixth aspect of the present disclosure, a monolithically integrated switch configured to operate at an input signal frequency ranging from 0 Hz to 80 GHz, the switch comprising: an input port configured to carry the input signal; a first output port and a second output port; a first conduction path between the input port and the first output port, comprising: a first group of one or more series connected switches coupled between the input port and the first output port; a first group of one or more shunting resistors coupled between the first group of one or more series connected switches and ground; and a second group of one or more series connected switches coupled between the first output port and ground; a second conduction path between the input port and the second output port, comprising: a third group of one or more series connected switches coupled between the input port and the second output port; a second group of one or more shunting resistors coupled between the third group of one or more series connected switches and ground; and a fourth group of one or more series connected switches coupled between the first output port and ground.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

FIG. 1D is a simplified diagram of delay line architecture including a plurality of delay line modules according to various embodiments.

FIG. 1I is a simplified diagram of a delay line module including an embedded T-attenuator and a plurality of stacked shunt switches according to various embodiments of the present disclosure.

FIG. 1J is a simplified diagram of a delay line module including an embedded T-attenuator and a stack of four shunt switches according to various embodiments of the present disclosure.

FIGS. 1L and 1M are simplified diagrams of delay line modules including a stack of four shunt switches.

FIG. 2C is a simplified block diagram of a delay line architecture including a plurality of delay line modules according to various embodiments of the present disclosure.

FIG. 2D is a simplified block diagram of a delay line architecture including three delay line modules according to various embodiments of the present disclosure.

FIG. 2E is a simplified block diagram of a delay line architecture including four delay line modules according to various embodiments of the present disclosure.

FIG. 3A is a simplified diagram of resistance seen by a load coupled to the delay line module shown in FIG. 1E according to various embodiments of the present disclosure.

FIG. 3B is a simplified diagram of resistance seen by a load coupled to the delay line module shown in FIG. 1F according to various embodiments of the present disclosure.

FIG. 3C is a simplified diagram of resistance seen by a load coupled to the delay line module shown in FIG. 1G according to various embodiments of the present disclosure.

FIG. 3D is a simplified diagram of resistance seen by a load coupled to the delay line module shown in FIG. 1H according to various embodiments of the present disclosure.

DETAILED DESCRIPTION

Throughout this description, embodiments and variations are described for the purpose of illustrating uses and implementations of the inventive concept. The illustrative description should be understood as presenting examples of the inventive concept, rather than as limiting the scope of the concept as disclosed herein.

Figure 1B:
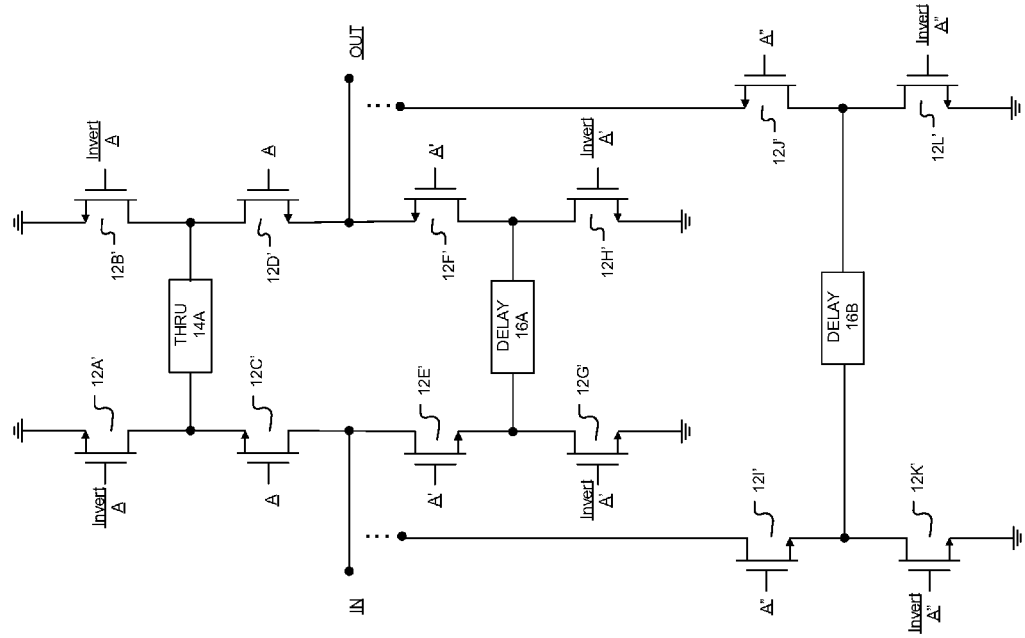
FIG. 1B is a simplified diagram of a delay line module including a plurality of delay modules according to various embodiments.
Figure 1A:
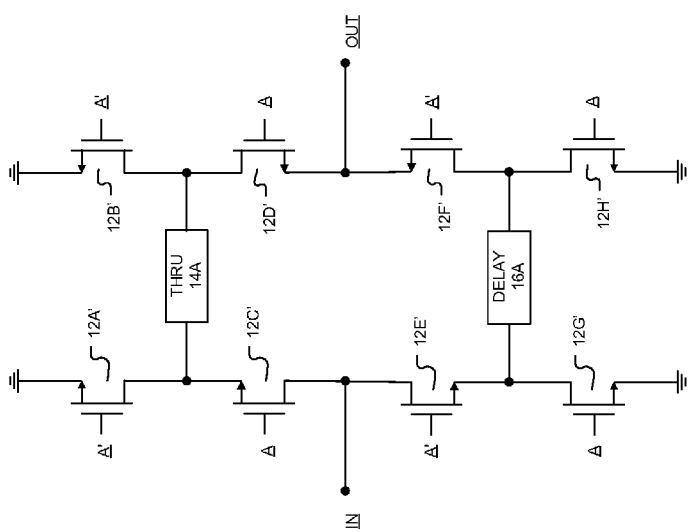
FIG. 1A is a simplified diagram of a delay line module according to various embodiments.

FIG. 1A is a simplified diagram of a delay line module 10A according to various embodiments. As shown in FIG. 1A, the module 10A may comprise a single pole double throw (SPDT) switch that includes a Thru module or path 14A and a Delay module or path 16A and a plurality of semiconductor switches 12A' to 12H' that function as a pair of SPDT switches. A first group of switches 12C', 12D', 12G', and 12H' are coupled to a first control signal A. A second group of switches 12A', 12B', 12E', and 12F' are coupled to a second control signal A'. In an embodiment, the delay line module 10A may operate in two modes. The person skilled in the art will understand that delay line module 10A represented in FIG. 1A includes a first SPDT switch comprising the switches (12A', 12C', 12E', 12G') and a second SPDT switch comprising the switches (12B', 12D', 12F', 12H') which are coupled, through the two throws of the switches, to the Thru module 14A and the Delay module 16A. In a first mode, the control signal A may be set to close the first group of switches 12C', 12D', 12G', and 12H' (pass signals) and the control signal A' may be set to open the second group of switches 12A', 12B', 12E', and 12F' (block or withstand signals). In the first mode (Pass Mode), a signal received at the IN port may be passed to the OUT port via the Thru module 14A. The Thru module 14A may pass a signal with no or nominal delay.

In a second mode (Delay Mode), the control signal A may be set to open the first group of switches 12C', 12D', 12G', and 12H' (block or withstand signals) and the control signal A' may be set to close the second group of switches 12A', 12B', 12E', and 12F' (pass signals). In the second, Delay mode, a signal received at the IN port may be passed to the OUT port via the Delay module 16A. The Delay module 16A, via a corresponding transmission path, may introduce a fixed, predetermined time delay to the signal. In an embodiment, the switches 12A' to 12H' may be field effect transistors (FET) and include a gate, source, and drain. The first control signal A may be coupled to each switch's 12C', 12D', 12G', and 12H' gate to determine whether a signal at its source (or drain) is passed to its drain (or source) or withstood by its source or drain. The control signal A therefore establishes or removes a conduction path between the drain and source terminals of each switch 12C', 12D', 12G', and 12H'.

The second control signal A' may be coupled to each switch's 12A', 12B', 12E', and 12F' gate to determine whether a signal at its source (or drain) is passed to its drain (or source) or withstood by its source or drain. As shown in FIG. 1A, switch 12A' is coupled to the IN side of the Thru module 14A and to ground. Switch 12B' is coupled to the OUT side of the Thru module 14A and to ground. Switch 12C' is coupled to the IN side of the Thru module 14A and to the IN port. Switch 12D' is coupled to the OUT side of the Thru module 14A and to the OUT port.

As also shown in FIG. 1A, switch 12E' is coupled to the IN side of the Delay module 16A and to the IN port. Switch 12F' is coupled to the OUT side of the Delay module 16A and to the OUT port. Switch 12G' is coupled to the IN side of the Delay module 16A and to ground. Switch 12H' is coupled to the OUT side of the Delay module 16A and to ground. In the first or Thru mode, switches 12C' and 12D' may direct a signal from the IN port to the OUT port via the Thru module 14A. Switches 12A' and 12B' may not pass signals from the Thru module 14A to ground. Switches 12E' and 12F' may not communicate signals with the Delay module 16A. Switches 12G' and 12H' may shunt the IN and OUT side of the Delay module 16A to ground to discharge any residual energy or charge.

In the second or Delay mode, switches 12E' and 12F' may direct a signal from the IN port to the OUT port via the Delay module 16A. Switches 12G' and 12H' may not pass signals from the Delay module 16A to ground. Switches 12C' and 12D' may not communicate signals with the Thru module 14A. Switches 12A' and 12B' may shunt the IN and OUT side of the Thru module 14A to ground to discharge any residual energy or charge. In an embodiment, the switches 12A' to 12H' may include Metal Oxide Semiconductor field effect transistors (MOSFET), Metal-semiconductor Field Effect Transistors (MESFET), other type field-effect transistor (FET), PN diodes, PIN diodes, and other semiconductor constructs known to the person skilled in the art. The semiconductor constructs may include silicon on insulator (SOI) or silicon on sapphire (SOS). In an embodiment, the switches 12A' to 12H' may be N-type MOSFETs formed on an insulator (e.g. SOI) including sapphire (SOS).

In an embodiment, a Delay module 16A may include a transmission path having a predetermined length that adds a predetermined time delay $\Delta t$ to the signal passed through the path (or Delay module). In an embodiment, the signal received at the IN port may be in the form of $A\cos(\omega t)$. The delay line module 10A may add $\Delta t$ to the signal $A\cos(\omega t)$ to produce the signal A cos(ω(t+Δt)) at the OUT port (in Delay mode). The delay module 16A may add a constant time delay Δt across a broad band of frequencies. The delay line module 10A may be employed in systems that process or modulate broadband signals of up to 80 GHz, such as systems used in cellular communication or other, and can in general be used, for any signal in the range of 0 Hz (DC) to 80 GHz.

In another embodiment, a Delay module 16A may further include a phase shift module that adds a predetermined phase shift Δϕ to a signal passed through the path (or Delay module). In an embodiment, the signal received at the IN port may be in the form of A cos(ωt). The delay line module 10A may add a phase shift Δϕ to the signal A cos(ωt) to produce the signal A cos(ωt+Δϕ) or alternatively written as A cos(ω(t+Δϕ/ω)) at the OUT port (in Delay mode). The delay module 16A may add a phase shift Δϕ that may be independent of frequency. In a further embodiment, a delay module 16A may add a phase shift Δϕ and a time delay Δt to a signal passed through the delay module to produce the signal (A cos(ω(t+Δϕ/ω+Δt))).

Figure 2A:
FIG. 2A is a simplified block diagram of a delay line architecture according to various embodiments of the present disclosure.

FIG. 2A is a simplified block diagram of a delay line architecture 20A according to various embodiments. As shown in FIG. 2A, architecture 20A includes an IN port and OUT port coupled to a single delay line module 10A. In architecture's 20A first or pass mode, a signal with the form of A cos(ωt) received at the IN port may be communicated substantially unchanged to the OUT port. In architecture's 20A second or Delay mode, a signal with the form of A cos(ωt) received at the IN port may be delayed by a predetermined, fixed time interval Δt or phase Δϕ and communicated to the OUT port as a signal having the form of A cos(ω(t+Δt+ω)). In other delay line architectures according to various embodiments, it may be desirable to pass signal with zero or nominal delay and a plurality of predetermined delays.

In an embodiment, a delay line architecture may delay a signal by a first time delay Δt, x*Δt, $x^2$*Δt, . . . to $x^n$*Δt or phase shift Δϕ, x*Δϕ, $x^2$*Δϕ, . . . to $x^n$*Δϕ to form a base x delay selection with n delay line modules 10A. In an embodiment, x may be 2 and the base delay may form a binary weighted word. FIGS. 2B-2E represent simplified block diagrams of delay line architectures 20B-20E that may pass a signal with zero or nominal delay and a plurality of predetermined delays. Delay line architectures may employ other combination of delay line modules that include different or similar predetermined delays.

Figure 2B:
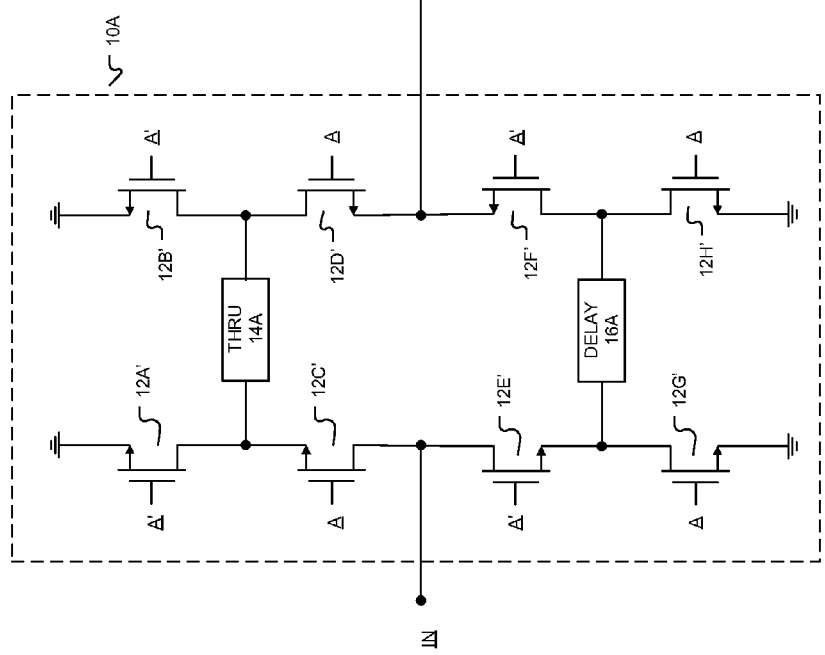
FIG. 2B is a simplified block diagram of a delay line architecture including two delay line modules according to various embodiments of the present disclosure.
Figure 2B:
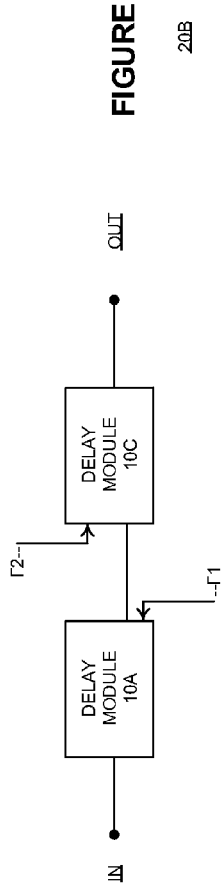

FIG. 2B is a simplified block diagram of a delay line architecture 20B including two serially coupled delay line modules 10A, 10C according to various embodiments. FIG. 2C is a simplified block diagram of a delay line architecture 20C including a plurality of serially coupled delay line modules 10A, 10C according to various embodiments. FIG. 2D is a simplified block diagram of a delay line architecture 20D including three serially coupled delay line modules 10A, 10C, and 10D' according to various embodiments. FIG. 2E is a simplified block diagram of a delay line architecture 20E including four serially coupled delay line modules 10A, 10C, 10D', and 10D" according to various embodiments.

In delay line architecture 20A-20E, n delay line modules 10A, 10C, 10D' and 10D", in series may introduce combinations of delays, no delay, or a nominal delay. In particular, architecture 20A-20E including n serially coupled delay line modules 10A, 10C, 10D' and 10D" may introduce a combination of $m^n$ different delays where m are the number of delay paths in each delay line module and n are the number of serially coupled modules. FIG. 1B is a simplified diagram of a delay line module 10B including a plurality of delay modules, 16A to 16B in addition to the thru module 14A according to various embodiments. As shown in FIG. 1B, the delay line module 10B further includes switches 12I' to 12L' and the delay module 16B. The delay module 16B may provide a different or same delay as delay module 16A in an embodiment. The delay module 16B operation may be regulated by control signal A". In particular, the control signal A" may cause a signal at the IN port to pass to the OUT port via the switch 12I', the delay module 16B, and the switch 12J'. Similar to the delay line module 10A of FIG. 1A, delay line module 10B includes a first single pole multiple throw switch comprising the switches (12A', 12C', 12E', 12G', 12I', 12K') and a second single pole multiple throw switch comprising the switches (12B', 12D', 12F', 12H', 12J', 12L') which are coupled, through the multiple throws of the two switches, to the Thru module 14A, the Delay module 16A and the Delay module 16B.

As shown in FIG. 1B, each pair of shunt switches (12A', 12B'), (12G', 12H'), and (12K', 12L') may shunt one of the plurality of adjacent delay modules 14A, 16A, and 16B. Each of the delay modules 14A, 16A, 16B receives a signal when a control signal A, A', or A", respectively is active (or high in embodiment). Each pair of shunt switches (12A', 12B'), (12G', 12H'), and (12K', 12L') may be made active when the control signal A, A', and A" of the related or adjacent delay module 14A, 16A, and 16B is inactive (or low in an embodiment). In delay line module 10B, m different delay paths may be selected, each delay path being associated to one of the m delay modules 14A, 16A, . . . , and 16B. An architecture including n serially coupled delay line modules 10B may introduce a combination of $(m)^n$ different delays, where m are the number of delay paths in the delay line module 10B, each associated to one of m delay modules 14A, 16A, . . . , and 16B.

Figure 1C:
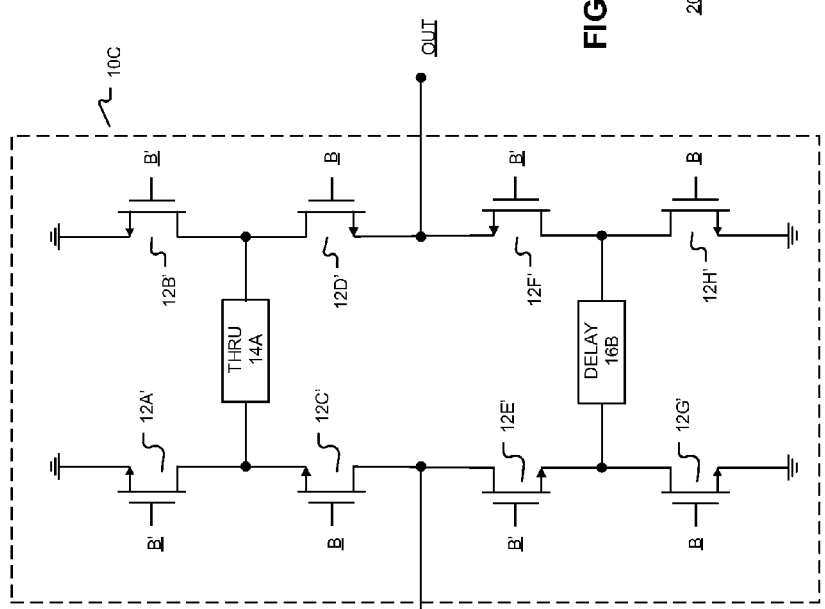
FIG. 1C is a simplified diagram of delay line architecture including two delay line modules according to various embodiments.

FIG. 1C is a simplified diagram of a delay line module 10C including two (n=2), serially coupled delay line modules 10A, 10C according to various embodiments. As shown in FIG. 1C, each delay line module 10A, 10C includes two transmission (delay, no delay) paths (m=2). Accordingly, Architecture 20B may introduce a combination of four (4), $2^2$ different delays. In an embodiment, delay line architecture 20B may pass a signal with 1) zero or nominal time delay (via modules' 10A and 10C thru 14A; 2) a first time delay (via module's 10A delay 16A); 3) a second time delay (via module's 10C delay module 16B); and 4) a third time delay (via both module's 10A delay 16A and module's 10C delay 16B). Delay line architecture 20D includes three serially coupled delay line modules 10A, 10C, and 10D'. In an embodiment, architecture 20D delay line modules 10A, 10C, 10D' may delay a signal by 8 ps (Pico-seconds), 16 ps, and 32 ps, respectively. Architecture 20D may form an effective 3-bit binary delay architecture in an embodiment.

Delay line architecture 20E includes four serially coupled delay line modules 10A, 10C 10D', and 10D". In an embodiment, architecture 20E delay line modules 10A, 10C, 10D', and 10D" may delay a signal by 8 ps (Pico-seconds), 16 ps, 32 ps, and 64 ps, respectively. Architecture 20E may form a 4-bit binary delay architecture in an embodiment. In each architecture 20B-20E, interactions (e.g. couplings) between delay line modules 10A, 10C, 10D', and 10D" may affect the operation of the module 10A, 10C, 10D', and 10D" and thus each architecture 20B-20E.

As noted and shown in FIG. 2B, delay architecture 20B may include an IN port, an OUT port, a first delay line module 10A and a second delay line module 10C. The first delay line module 10A may be serially coupled to the second delay line module 10C. The IN port may be coupled to the first delay line module 10A IN port. The OUT port may be coupled to the second delay line module 10C OUT port. The first delay line module 10A OUT port may be coupled to the second delay line module 10C IN port. In an embodiment, the first delay line module 10A may pass a signal with zero or nominal delay and a first predetermined delay $\Delta t_1$. The second delay line module 10C may pass a signal with zero or nominal delay and a second predetermined delay $\Delta t_2$. The delays $\Delta t_1$, $\Delta t_2$ may be the same or different. In an embodiment, the second delay $\Delta t_2$ may be multiple of the first delay $\Delta t_1$ (or vice versa).

FIG. 1C is a simplified diagram of delay line architecture 20B including two delay line modules 10A, 10C according to various embodiments. As shown in FIG. 1C, delay line module 10A is similar to the module shown in FIG. 1A according to various embodiments with its operation controlled by signals A and A'. Delay line module 10C is also similar to delay module 10A with its operation controlled by signals B and B'. In an embodiment, delay line module 10C via its Delay module 16B may introduce a delay $\Delta t_2$ to a signal received at the delay line module 10C IN port. Delay line module 10A via its Delay module 16A may introduce a delay $\Delta t_1$ to a signal received at the delay line module 10A IN port. As noted in an embodiment, the delays $\Delta t_1$, $\Delta t_2$ and may be the same, different, and the second delay $\Delta t_2$ may be multiple of the first delay $\Delta t_1$ (or vice versa).

In the embodiment, when the impedance at a serially coupled delay line module 10C IN port is not matched with the impedance of the adjacent delay line module 10A OUT port, one or more signal reflections Γ1, Γ2 (FIG. 2B) may pass between the serially coupled modules 10A, 10C. As shown in FIG. 2D, additional signal reflections Γ3, Γ4 may pass between the serially coupled modules 10C, 10D'. As further shown in FIG. 2E, architecture 20E may further include signal reflections Γ5, Γ6, Γ7, and Γ8 that may pass between the serially coupled modules 10D' and 10D".

A reflective signal Γ2, Γ4, Γ6, Γ8 may be a portion of a signal produced at the first delay line module 10A, 10C, 10D', and 10D" OUT port reflected back to a module 10A, 10C, and 10D'OUT port by an adjacent delay line module 10C, 10D', and 10D". The reflective signal Γ1, Γ3, Γ5 may be a portion of a signal Γ2, Γ4, Γ6, respectively reflected back to a module 10C, 10D', and 10D" IN port by an adjacent delay line module 10A, 10C, and 10D'. The reflected signals Γ1, Γ2, between modules 10A, 10C, Γ3, Γ4 between modules 10C, 10D', Γ5, Γ6 between modules 10D', 10D", and Γ7, Γ8 within module 10D" may cause linear phase deviations (of a signal transmitted through modules 10A, 10C, 10D' and 10D") that may degrade performance at the various modules 10A, 10C, 10D', and 10D". The magnitude of the phase deviation or error between adjacent, serially coupled modules, such as modules 10A and 10C may be a function of the magnitude of their reflections, such as equal to the multiple of the magnitude of their reflections, and about |Γ1*Γ2| in an embodiment.

These reflections Γ1, Γ2, Γ3, Γ4, Γ5 Γ6, Γ7, Γ8 in architectures 20B-20E are known as Voltage Standing Wave Reflections (VSWR). The magnitude of VSWR between two adjacent delay line modules 10A, 10C, 10D', and 10D" may be equal to:

$$\frac{1+|\rho|}{1-|\rho|}$$

where, $$\rho = \frac{z_{load} - z_o}{z_{load} + z_o}$$

In an embodiment, $Z_{load}$ may be the impedance seen at a downstream delay line module 10C, 10D', and 10D" IN port and $Z_o$ may be the impedance seen at an upstream, adjacent delay line module 10A, 10C, and 10D' OUT port.

FIGS. 1E-1J are simplified diagrams of delay line architectures 10E-10J including a plurality of delay line modules according to various embodiments of the present disclosure. In each architecture 10E-10J, one or more resistors 16A', 16A", 16B', 16B", 16C', 16C", 16D', and 16D" may be coupled in various configurations with semiconductor switches 12C', 12C", 12D', 12D", 12E', 12E", 12F', or 12F'". Port signal conducting semiconductor switches (port switches) 12C', 12C", 12D', 12D", 12E', 12E", 12F', or 12F'" couple an IN port or an OUT port to a thru module 14A or a delay module 16A. The embedded resistors 16A', 16A", 16B', 16B", 16C', 16C", 16D', and 16D" coupled with the port switches may reduce a return loss created by reflected signals Γ1, Γ2, Γ3, Γ4, Γ5 Γ6, Γ7, Γ8 between delay line modules 10A, 10C, 10D', and 10D". Such return loss reduction may reduce the VSWR between adjacent delay line modules 10A, 10C, 10D', and 10D" and the magnitude of phase deviations or errors that serially coupled delay line modules 10A, 10C, 10D', and 10D" can have on a transmitted signal.

Figure 1F:
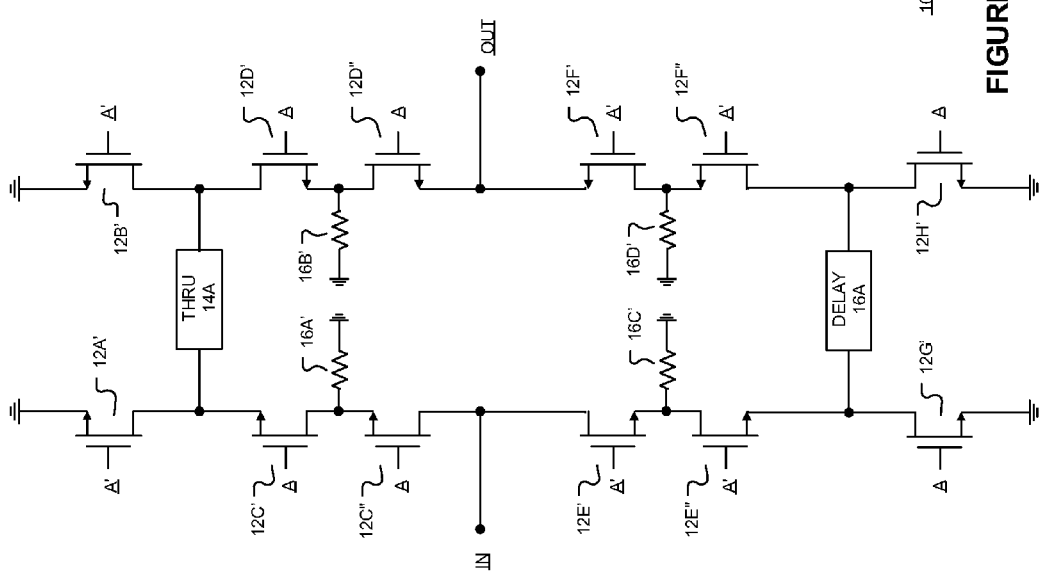
FIG. 1F is a simplified diagram of a delay line module including an embedded T-attenuator according to various embodiments of the present disclosure.
Figure 1E:
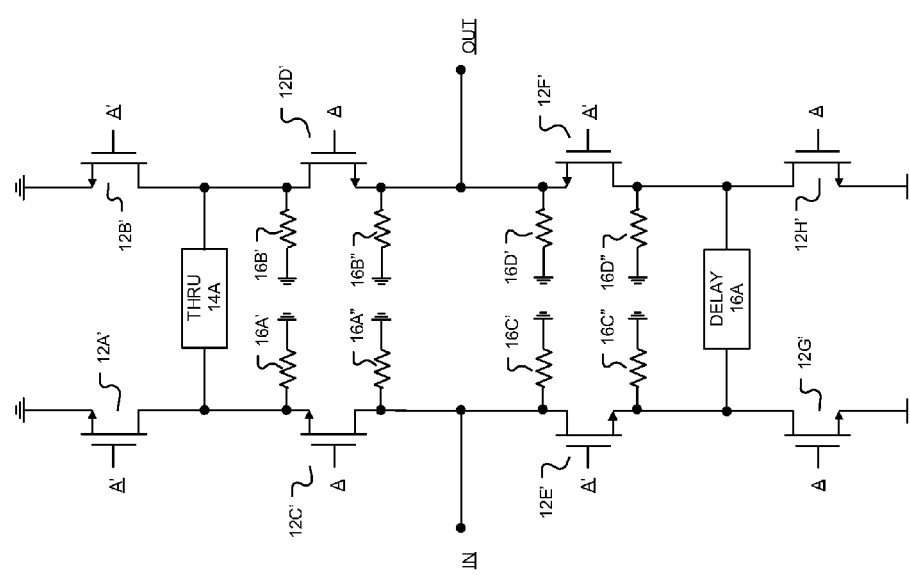
FIG. 1E is a simplified diagram of a delay line module including an embedded Pi-attenuator according to various embodiments of the present disclosure.

FIG. 1E is a simplified diagram of a delay line module 10E including an embedded Pi-attenuator construct according to various embodiments of the present disclosure. The delay module 10E is similar to delay line modules 10A, 10C with the addition of resistors 16A', 16A", 16B', 16B", 16C', 16C", 16D', and 16D". In delay line module 10E, a pair of resistors (16A', 16A"), (16B', 16B"), (16C', 16C"), and (16D', 16D") is coupled about each port signal conducting switch 12C', 12D', 12E', 12F' and ground. As noted, switches 12C' and 12D' couple an IN port and an OUT port to a Thru module 14A, respectively. Switches 12E' and 12F' couple an IN port and an OUT port to a Delay module 16A, respectively.

In an embodiment, a first resistor 16A' of the (16A', 16A") resistor pair is electrically connected, at a first terminal of the resistor 16A', to the switch 12C' and the Thru module 14A, and to ground at a second terminal of the resistor. A second resistor 16A" of the (16A', 16A") resistor pair is electrically connected, at a first terminal of the resistor 16A", to the switch 12C' and the IN port, and to ground at a second terminal of the resistor. In an embodiment, a first resistor 16B' of the (16B', 16B") resistor pair is electrically connected, at a first terminal of the resistor 16B', to the switch 12B' and the Thru module 14A, and to ground at a second terminal of the resistor. A second resistor 16B" of the (16B', 16B") resistor pair is electrically connected, at a first terminal of the resistor 16B", to the switch 12B' and the OUT port, and to ground at a second terminal of the resistor.

In an embodiment, a first resistor 16C' of the (16C', 16C") resistor pair is electrically connected, at a first terminal of the resistor 16C', to the switch 12E' and the IN port, and to ground at a second terminal of the resistor. A second resistor 16C" of the (16C', 16C") resistor pair is electrically connected, at a first terminal of the resistor 16C", to the switch 12E' and the Delay module 16A, and to ground at a second terminal of the resistor. In an embodiment, a first resistor 16D' of the (16D', 16D") resistor pair is electrically connected, at a first terminal of the resistor 16D', to the switch 12F' and the Out port, and to ground at a second terminal of the resistor. A second resistor 16D" of the (16D', 16D") resistor pair is electrically connected, at first terminal of the resistor 16D", to the switch 12F' and the Delay module 16A, and to ground at the second terminal of the resistor.

Figure 3E:
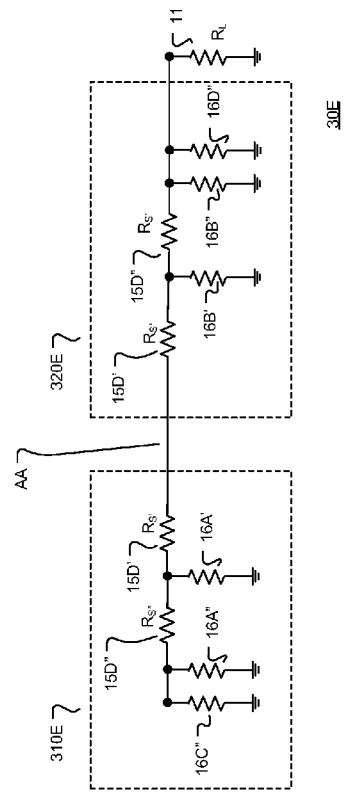
FIG. 3E is a more complete diagram of resistance seen by a load coupled to the delay line module shown in FIG. 1H according to various embodiments of the present disclosure.

As explained with reference to FIG. 3A, a delay line module 10A, 10C, 10D', 10D" in architecture 20B-20D adjacent to module 10E may have reduced reflections due the resistors 16A', 16A", 16B', 16B", 16C', 16C", 16D', and 16D" present in the conduction path between the respective coupled modules during different operational modes (e.g. Pass/Delay modes). It is noted that according to further embodiments of the present disclosure, additional resistor pairs may be placed about the switches 12I' and 12J' of the delay line module 10B shown in FIG. 1B to reduce reflections of signals passed through these switches and the delay module 16B. Such resistor pair placements could be employed for a plurality of delay modules 16B in a delay line module 10B having a plurality of delay modules 16A . . . 16B.

FIG. 3A is a simplified diagram of resistance 30A seen by a load 11 coupled to the delay line module 10E of FIG. 1E. In particular, a load 11 is coupled to the OUT port of the delay line module 10E while conducting a signal via the switch 12D' according to various embodiments of the present disclosure. The load resistance $R_L$ of the load 11 may represent the load of an adjacent (coupled) delay line module 10A, 10C, 10D', 10D" or other module. The resistor $R_{S'}$ 15D' may represent the impedance of a semiconductor switch 12D' while conducting a signal. The combination of the resistors 16B', 16B" with the switch 12D' may reduce the (equivalent) series resistance of switch 12D' seen by the load $R_L$ 11. Such series resistance reduction according to the embodiment of the present disclosure may reduce the return loss and VSWR magnitude of the delay line module 10E that would otherwise be increased by the switch 12D' resistance alone. According to further embodiments of the present disclosure, the impedance of the resistors 16B', 16B" may be varied as a function of the load $R_L$ 11 impedance and the switch 12D' impedance $R_{S'}$ 15D' when conducting (RON).

In an embodiment according to the present disclosure, the resistors 16B' and 16B" may have a resistance of ranging from 100 ohms to 5000 ohms. Assuming the impedance of 16B' and 16B" are equal and termed $R_p$, it can be shown to balance the impedance for a VSWR of 1.0, the equation $R_p^2 * R_S - 2 * R_p * R_L^2 = R_S * R_L^2$ should be met. In an embodiment, when $R_L$ is about 50 ohms and $R_s$ is about 2 ohms, $R_p$ is about 2501 ohms. In such an embodiment, resistor 16B' may be about 2501 ohms.

FIG. 1F is a simplified diagram of a delay line module 10F including an embedded T-attenuator construct according to various embodiments of the present disclosure. The delay module 10F is similar to delay line modules 10A, 10C. Delay line module 10F, however includes two stacked switches, 12C' and 12C", to couple an IN port to a Thru module 14A, and two stacked switches, 12D' and 12D", to couple an OUT port to the Thru module 14A. Delay line module 10F further includes two stacked switches, 12E' and 12E", to couple the IN port to a Delay module 16A, and two stacked switches, 12F' and 12F", to couple the OUT port to the Delay module 16A. In MOSFET formed on SOI, a voltage across stacked devices (12C', 12C"), (12D', 12D"), (12E', 12E"), and (12F', 12F") may be divided based on the device sizes and enable the stacked devices to process and withstand larger voltage signals. As used in the present disclosure, the expressions "stacked switches" and "series connected switches" are used interchangeably and refer to two or more switches, such as FET transistors connected in a source-drain-source configuration, which are connected such that to provide a low impedance conduction path when the two or more switches are closed (ON), and to provide a high impedance conduction path when at least one of the two or more switches is open (OFF).

In delay module 10F, a resistor 16A' may be connected, via a first terminal of the resistor 16A', to a common node of the two stacked switches 12C' and 12C", and to ground via a second terminal of the resistor, and a resistor 16B' may be connected, via a first terminal of the resistor 16B', to a common node of the two stacked switches 12D' and 12D", and to ground via a second terminal of the resistor. Similarly, a resistor 16C' may be connected, via a first terminal of the resistor 16C', to a common node of the two stacked switches 12E' and 12E", and to ground via a second terminal of the resistor, and a resistor 16D' may be connected, via a first terminal of the resistor 16D', to a common node of the two stacked switches 12F' and 12F", and to ground via a second terminal of the resistor. As explained with reference to FIG. 3B, a delay line module 10A, 10C, 10D', 10D" or other device in architecture 20B-20D adjacent to module 10F may have reduced reflections due the resistors 16A', 16B', 16C', and 16D' present in the conduction path between the respective coupled modules during different operational modes, where the different operational modes are based on a provided Pass or Delay mode of operation of the constituent delay line modules.

FIG. 3B is a simplified diagram of resistance 30B seen by a load 11 coupled to the delay line module 10F of FIG. 1F. In particular, a load 11 is coupled to the OUT port of the delay line module 10F while conducting a signal via the stacked switches 12D', 12D" according to various embodiments of the present disclosure. The load resistance $R_L$ of the load 11 may represent the load of an adjacent (coupled) delay line module 10A, 10C, 10D', 10D" or other module. The resistors $R_{S'}$ 15D' and $R_{S"}$ 15D" may represent the impedance of semiconductor switches 12D', 12D", respectively while conducting a signal. The combination of the resistor 16B' and the switches 12D', 12D" may offset or reduce the (equivalent) series resistance of the switches 12D', 12D" seen by the load $R_L$ 11. Such series resistance reduction according to the embodiment of the present disclosure may reduce the return loss and VSWR magnitude of the delay line module 10F that would otherwise be increased by the switches 12D', 12D" resistance alone. According to further embodiments of the present disclosure, the impedance of the resistor 16B' may be varied as a function of the load $R_L$ 11 impedance and the switches 12D', 12D" impedances $R_{S'}$ 15D', $R_{S"}$ 15D" when conducting (RON).

With continued reference to FIG. 3B, in an embodiment according to the present disclosure, the resistor 16B' may have a resistance of ranging from 100 ohms to 5000 ohms. Terming the impedance of 16B' as $R_p$, it can be shown to balance the impedance for a VSWR of 1.0, $$R_P = \frac{(R_{s'} - R_{s"}) * R_L}{(R_{s'} + R_{s"})} - \frac{(R_{s'} * R_{s"})}{(R_{s'} + R_{s"})} + \frac{R_L^2}{(R_{s'} + R_{s"})}.$$

In an embodiment, when $R_L$ is about 50 ohms and $R_{s'}$ and $R_{s"}$ is about 2 ohms, $R_p$ is about 624 ohms. In such an embodiment, each resistor 16B', 16B" may be about 624 ohms.

Figure 1H:
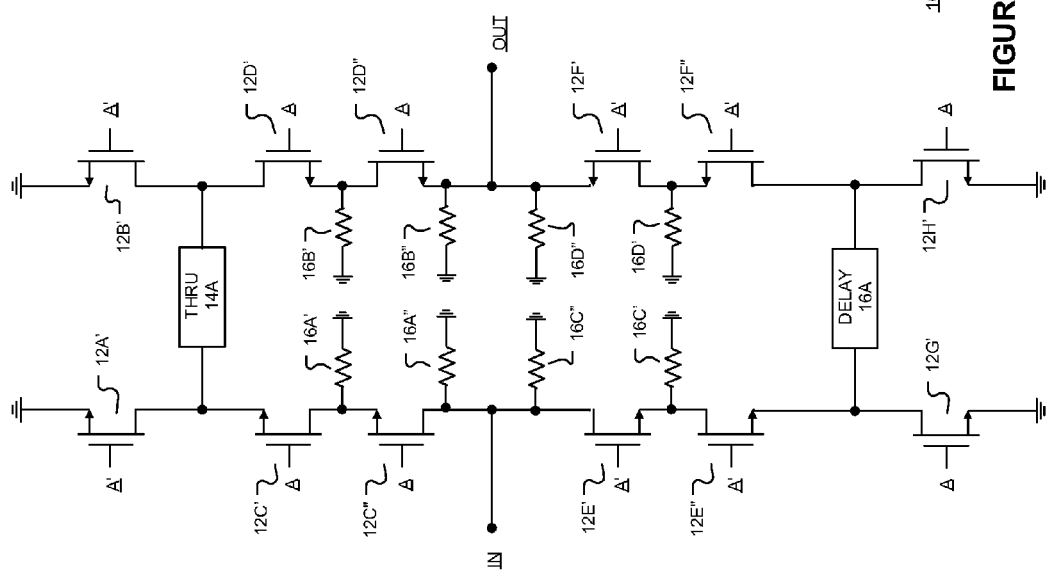
FIG. 1H is a simplified diagram of a delay line module including a modified Pi-attenuator according to various embodiments of the present disclosure.
Figure 1G:
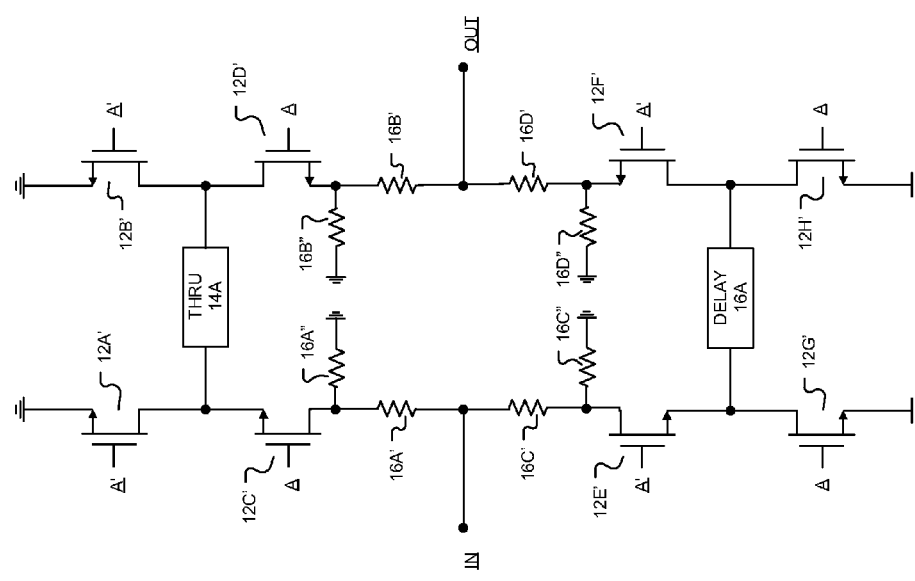
FIG. 1G is a simplified diagram of a delay line module including another embedded T-attenuator according to various embodiments of the present disclosure.

FIG. 1G is a simplified diagram of a delay line module 10G including an embedded T-attenuator construct according to various embodiments of the present disclosure. The delay module 10G is similar to the delay line module 10E. In delay line module 10G, a first resistor 16A' 16B', 16C', and 16D' may be coupled in series between a switch 12C', 12D', 12E', 12F' and a port (IN or OUT). A second resistor 16A", 16B", 16C", and 16D" may be connected, via a first terminal of the second resistor, to the switches 12C', 12D', 12E', 12F' and resistors 16A' 16B', 16C', and 16D', and to ground via a second terminal of the second resistor.

As explained with reference to FIG. 3C, a delay line module 10A, 10C, 10D', 10D" or other device in architecture 20B-20D adjacent to module 10G may have reduced reflections due the resistors 16A', 16A", 16B', 16B", 16C', 16C", 16D', and 16D" present in the conduction path between the respective coupled modules during different operational modes.

FIG. 3C is a simplified diagram of resistance 30C seen by a load 11 coupled to the delay line module 10G of FIG. 1G. In particular, a load 11 is coupled to the OUT port of the delay line module 10G while conducting a signal via the switch 12D' according to various embodiments of the present disclosure. The load resistance $R_L$ of the load 11 may represent the load of an adjacent (coupled) delay line module 10A, 10C, 10D', 10D" or other module. The resistor $R_{S'}$ 15D' may represent the impedance (RON) of a semiconductor switch 12D' while conducting a signal. The combination of the resistors 16B', 16B" with the switch 12D' may reduce or offset the (equivalent) series resistance of switch 12D' seen by the load $R_L$ 11. Such series resistance reduction or offset according to the embodiment of the present disclosure may reduce the return loss and VSWR magnitude of the delay line module 10G that would otherwise be increased by the switch 12D' resistance alone. According to further embodiments of the present disclosure, the impedance of the resistors 16B', 16B" may be varied as a function of the load $R_L$ 11 impedance and the switch 12D' impedance $R_{S'}$ 15D' when conducting (RON).

With continued reference to FIG. 3C, in an embodiment according to the present disclosure, the resistors 16B' and 16D' may have a resistance of ranging from 1 ohms or lesser, such as 0.1 ohms, to 5000 ohms, whereas resistors 16B" and 16D" may have a resistance ranging from 10 ohms to 5000 ohms. According to some embodiments of the present disclosure, resistors 16B' and 16D' can be substantially smaller than resistors 16B" and 16D", such as, for example, one or more orders of magnitude smaller. According to further embodiments of the present disclosure, impedance value of 16B' and 16D' may be substantially equal to the RON impedance $R_{S'}$ of switch 12D'. Assuming the impedance of 16B" (equal to 16D") is termed $R_p$ and impedance of 16B' (equal to 16D') is equal to RS', it can be shown to balance the impedance for a VSWR of 1.0, the equation (1) below must be satisfied:

$$(((((((R_L\|(R_S+Rp))+R_{S'})\|Rp)+2R_{S'})\|Rp)+R_{S'})\|(R_S+Rp))=R_L \quad (1)$$

In an embodiment, where $R_L$ is about 50 ohms and $R_{S'}$, equal to impedance of 16B' and 16D', is about 2 ohms, Rp may be about 1253 ohms.

FIG. 1H is a simplified diagram of a delay line module 10H including a modified Pi-attenuator construct according to various embodiments of the present disclosure. The delay module 10H is similar to the delay line module 10F. In delay module 10H, a second resistor 16A" may be connected, via a first terminal of the second resistor 16A", to the switch 12C" and IN port, and to ground via a second terminal of the second resistor 16A", and a second resistor 16B" may be connected, via a first terminal of the second resistor 16B", to the switch 12D" and OUT port, and to ground via a second terminal of the second resistor 16B". Similarly, a second resistor 16C" may be connected, via a first terminal of the second resistor 16C", to the switch 12E' and IN port, and to ground via a second terminal of the second resistor 16C", and a second resistor 16D" may be connected, via a first terminal of the second resistor 16D", to the switch 12F' and OUT port, and to ground via a second terminal of the second resistor 16D". As explained with reference to FIG. 3B, a delay line module 10A, 10C, 10D', 10D" or other device in architecture 20B-20D adjacent to module 10H may have reduced reflections due the resistors 16A', 16A", 16B', 16B", 16C', 16C", 16D', and 16D" present in the conduction path between the respective coupled modules during different operational modes.

FIG. 3D is a simplified diagram of resistance 30D seen by a load 11 coupled to the delay line module 10H of FIG. 1H. In particular, a load 11 is coupled to the OUT port of the delay line module 10H while conducting a signal via the stacked switches 12D', 12D" according to various embodiments of the present disclosure. The load resistance $R_L$ of the load 11 may represent the load of an adjacent (coupled) delay line module 10A, 10C, 10D', 10D" or other module. The resistors $R_{S'}$ 15D' and $R_{S''}$ 15D" may represent the impedance of semiconductor switches 12D', 12D", respectively while conducting a signal. The combination of the resistors 16B' and 16B" and the switches 12D', 12D" may offset or reduce the (equivalent) series resistance of the switches 12D', 12D" seen by the load $R_L$ 11. Such series resistance reduction or offset according to the embodiment of the present disclosure may reduce the return loss and VSWR magnitude of the delay line module 10H that would otherwise be increased by the switches 12D', 12D" resistance alone. According to further embodiments of the present disclosure, the impedance of the resistors 16B' and 16B" may be varied as a function of the load $R_L$ 11 impedance and the switches 12D', 12D" impedances $R_{S'}$ 15D', $R_{S''}$ 15D" when conducting (RON).

With continued reference to FIG. 3D, in an embodiment according to the present disclosure, the resistors 16B', 16B" and 16D" may have a resistance ranging from 10 ohms to 5000 ohms. Assuming the impedance of 16B', 16B" and 16D" are equal and termed $R_p$, and impedance $R_{S''}$ is equal to impedance $R_{S'}$, it can be shown to balance the impedance for a VSWR of 1.0, the equation (2) below must be satisfied:

$$(((((((R_L\|(Rp/2))+R_{S'})\|Rp)+2R_{S'})\|Rp)+R_{S'})\|(Rp/2))=R_L \quad (2)$$

In an embodiment, when $R_L$ is about 50 ohms and $R_{s'}$ and $R_{s''}$ are about 2 ohms, $R_p$ may be about 25.33 ohms. In such an embodiment, each resistor 16B', 16B" and 16D" may be about 1883 ohms.

With further reference to resistances 30A-30D depicted in FIGS. 3A-3D and described in the above sections of the present disclosure, according to further embodiments of the present disclosure, such resistances can be sized differently according to different sizes ($R_{s'}$, $R_{s''}$) of the FET switches used in the attenuation structures, while still obtaining a VSWR of 1.0 by balancing the impedance of the attenuation structure based on the resistance $R_p$ and the above mentioned equations.

As mentioned above, it should be noted that resistances 30A-30D depicted in FIGS. 3A-3D represent simplified equivalent resistances seen by the load 11 (RL) coupled to the output of the corresponding delay line modules 10E-10H of FIGS. 1E-1H. Such resistances are shown between the load 11 (RL) and the output of a corresponding Thru module 14A or Delay module 16A. Various calculations performed above to obtain resistance value Rp for a desired load impedance value (RL) are made by taking into consideration the entire impedance seen at the load 11 (RL), which includes impedances between an input of the Thru/Delay module (14A/16A) and the IN port of the delay lines modules 10E-10H, latter impedance being, due to the symmetrical construction of the delay line modules around the Thru/Delay module (14A/16A), symmetrical to the impedance shown in FIGS. 3A-3D. A sample of an entire impedance 30E seen by load 11 (RL) for the case of the delay line module 10H is depicted in FIG. 3E. Impedance 30E of FIG. 3E comprises impedances 310E and 320E which are symmetrical with respect to a center point AA of the impedance 30E. Impedance 310E is associated to the first SPDT switch of the delay line module 10H, coupled to the IN port, which comprises semiconductor switches (12A', 12C', 12C'', 12E', 12E'', 12G'), and impedance 320E is associated to the second SPDT switch of the delay line module 10H, coupled to the OUT port, which comprises semiconductor switches (12B', 12D', 12D'', 12F', 12F'', 12H'). Equation (2) above was derived via impedance 30E seen by load 11 (RL) coupled to the OUT port of the delay line module 10H.

According to an embodiment of the present disclosure, the attenuator construct according to the various embodiments of the present disclosure can provide an impedance transformation. Such impedance transformation can be provided by a minimum insertion loss pad known to the person skilled in the art, which can have a first port (input port) of the attenuator construct referenced to a first impedance Z1, and a second port of the attenuator construct referenced to a second impedance Z2 different from impedance Z1. Such addition of the minimum insertion loss pad to the attenuator construct can allow, for example, to provide a VSWR of 1.0 to a load different from 50 ohms.

FIG. 1I is a simplified diagram of a delay line module 10I including an embedded T-attenuator construct and a plurality of stacked shunt switches 12A', 12A'', 12B', 12B'', 12G', 12G'', 12H', 12H'' according to various embodiments of the present disclosure. The delay module 10I is similar to the delay line module 10F with a plurality of stacked shunt switches 12A', 12A'', 12B', 12B'', 12G', 12G'', 12H', 12H''. The delay line module 10I includes a plurality of stacked shunt switches 12A', 12A'' to couple the Thru module 14A IN port to ground and a plurality of stacked shunt switches 12B', 12B'' to couple the Thru module 14A OUT port to ground. Further, delay line module 10I includes a plurality of stacked shunt switches 12G', 12G'' to couple the Delay module 16A IN port to ground and a plurality of stacked shunt switches 12H', 12H'' to couple the Delay module 16A OUT port to ground. As noted in MOSFETs formed on SOI, a voltage across stacked devices (12A', 12A''), (12B', 12B''), (12G', 12G''), and (12H', 12H'') may be divided across the plurality of devices based on the device's sizes and enable the stacked devices to process and withstand larger voltage signals.

FIG. 1J is a simplified diagram of a delay line module 10J including an embedded T-attenuator construct and a stack of four (4) shunt switches 12A' to 12A'''', 12B' to 12B'''', 12G' to 12G'''', and 12H' to 12H'''' according to various embodiments of the present disclosure. The delay module 10J is similar to the delay line module 10I with a fixed number of stacked shunt switches 12A' to 12A'''', 12B' to 12B'''', 12G' to 12G'''', and 12H' to 12H''''. Delay line module 10J includes a stack of four (4) shunt switches 12A' to 12A'''' to couple the Thru module 14A IN port to ground and a stack of four (4) shunt switches 12B' to 12B'''' to couple the Thru module 14A OUT port to ground. Further, delay line module 10H includes a stack of four (4) shunt switches 12G' to 12G'''' to couple the Delay module 16A IN port to ground and a stack of four (4) shunt switches 12H' to 12H'''' to couple the Delay module 16A OUT port to ground. As noted, in MOSFETs formed on SOI, a voltage across stacked devices 12A' to 12A'''', 12B' to 12B'''', 12G' to 12G'''', and 12H' to 12H'''' may be divided across the plurality of devices based on the device sizes and enable the stacked devices to process and withstand larger voltage signals.

Figure 1K:
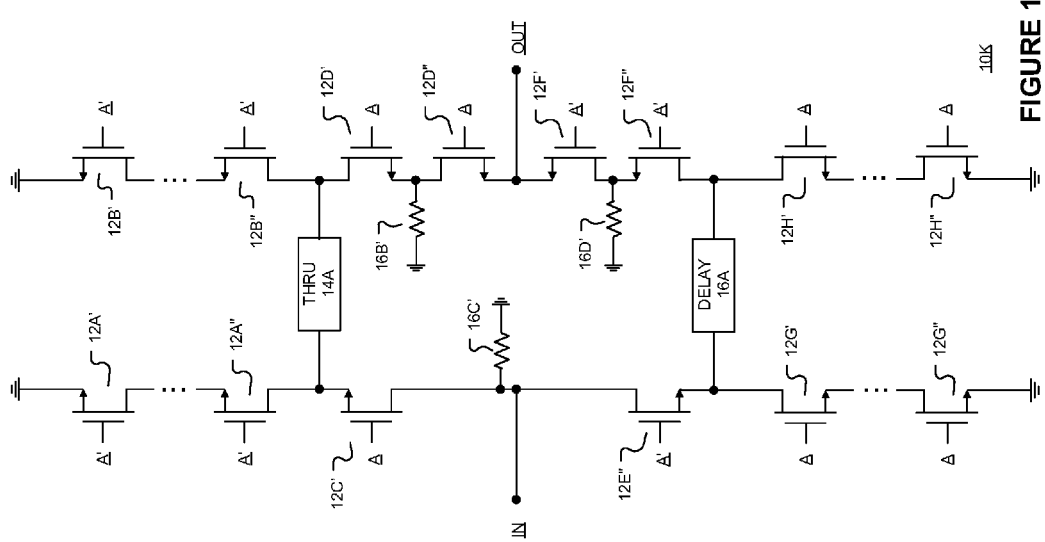
FIG. 1K is a simplified diagram of a delay line module including an embedded L-attenuator and a plurality of stacked shunt switches according to various embodiments of the present disclosure.

FIG. 1K is a simplified diagram of a delay line module 10K including an embedded L-attenuator construct at an input side of the delay line module and a T-attenuator construct at an output side of the delay line module according to a further embodiment of the present disclosure. The delay line module 10K depicted in FIG. 1K further comprises a stack of shunt switches 12A' to 12A'''', 12B' to 12B'''', 12G' to 12G'''', and 12H' to 12H'''' which can be used to couple input/output ports of the Thru module 14A and Delay module 16A to ground. The delay module 10K is similar to the delay line module 10I with the exception of the type of the embedded attenuator at the input side of the delay line module. It should be noted that similar to the delay line module 10J, the number of stacked shunt switches 12A' to 12A'''', 12B' to 12B'''', 12G' to 12G'''', and 12H' to 12H'''' can be fixed to a desired value, such as, for example, 4, and can be dependent on a desired voltage handling of the stacked switches. Delay line module 10K includes a stack of shunt switches 12A' to 12A'''' to couple the Thru module 14A IN port to ground and a stack of shunt switches 12B' to 12B'''' to couple the Thru module 14A OUT port to ground. Further, delay line module 10K includes a stack of shunt switches 12G' to 12G'''' to couple the Delay module 16A IN port to ground and a stack of shunt switches 12H' to 12H'''' to couple the Delay module 16A OUT port to ground. As noted, in MOSFETs formed on SOI, a voltage across stacked devices 12A' to 12A'''', 12B' to 12B'''', 12G' to 12G'''', and 12H' to 12H''' may be divided across the plurality of devices based on the device sizes and enable the stacked devices to process and withstand larger voltage signals.

The L-attenuator of the delay line module 10K is formed by the combination of the resistor 16C' and switch FET 12C' for the case where the delay line module operates in the Pass mode, and by the combination of the resistor 16C' and switch FET 12E'' for the case where the delay line module operates in the Delay mode. Such L-attenuator structure, similar to the T- and Pi-attenuator structures described in the above sections of the present disclosure can equally be used to reduce signal reflections and thereby decrease VSWR magnitude of two adjacent delay line modules. Due to its single resistor usage, an L-attenuator structure can use a smaller die area and have a lower power handling capability compared to the other structures presented above. Similar to the delay line module 10K, the person skilled in the art will understand that an attenuator structure used at the input side of a delay line module can be a different structure than an attenuator structure used at the output side of the delay line module, while keeping the same functionality with respect to reducing signal reflections as described in the above sections of the present disclosure.

Figure 4B:
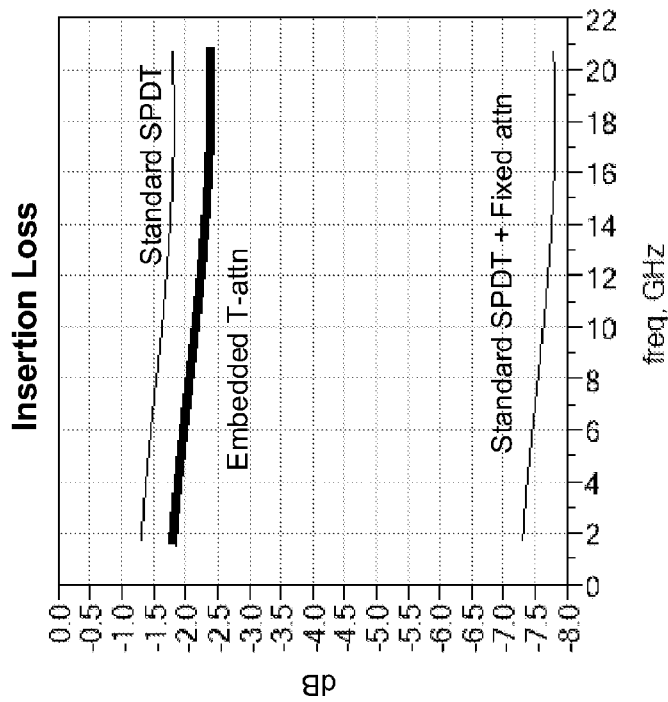
FIGS. 4A and 4B contain data plots representative of input return loss and insertion loss obtained by the delay line modules depicted in FIGS. 1J-1M.
Figure 4A:
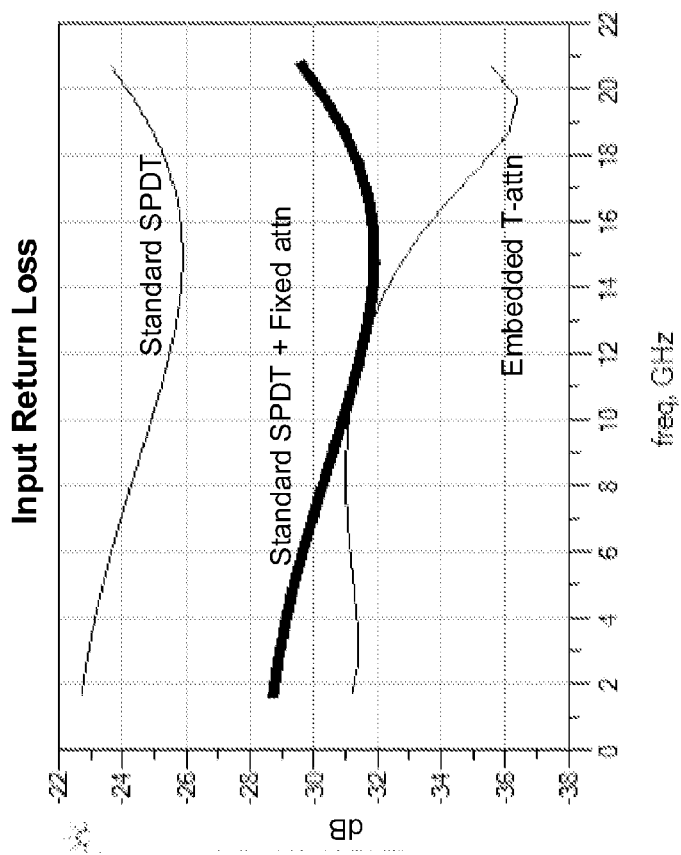

FIG. 1L depicts a prior art delay line module 10L, similar to the delay line module 10J, where no integrated (embedded) attenuator construct is provided. FIG. 1M depicts a prior art delay line module 10M, similar to the prior art delay line module 10L, where fixed attenuators are provided at the IN port and at the OUT port of the delay line module to reduce the VSWR. The inventors of the present disclosure have compared broadband (e.g. 0-80 GHz) performance of the prior art delay line modules 10L and 10M to a similar delay line module according to the various embodiments of the present disclosure where integrated (embedded) attenuating structures (e.g. T-attenuator) are used. Data derived from such comparison study is presented in the plots depicted in FIGS. 4A-4B, where the plots labelled as Standard SPDT, Standard SPDT+Fixed Attn and Embedded T-Attn respectively correspond to data representing performance of prior art module 10L, prior art module 10M and module 10J according to the embodiments of the present disclosure. Based on such plots, the person skilled in the art will appreciate the advantages provided by the embodiment according to the present disclosure represented by the delay line module 10J, which provides for at least 6 dB improvement of the input return loss (equivalent to VSWR) for a small increase of the insertion loss when compared to the prior art embodiment 10L, and provides for a similar input return loss while reducing the insertion loss by 5.5 dB when compared to the prior art embodiment 10M.

The benefits obtained from the embedded attenuator constructs provided within the delay line modules according to the various embodiments of the present disclosure can be associated to the integrated nature of such embedded attenuators. According to the various embodiments of the present disclosure, the various semiconductor switches and embedded attenuators of a delay line module (e.g. 10E-10K) can be monolithically integrated entirely or partially within a same integrated circuit. According to some embodiments of the present disclosure, each of the two single pole multiple throw switches of a delay line module (e.g. 10E-10K) according to the present teachings along with the corresponding embedded attenuation construct can be monolithically integrated. Monolithic integration can be provided by various process technologies known to the skilled person, such as, bulk silicon CMOS, silicon on insulator (SOI) CMOS and silicon on sapphire (SOS) CMOS, as well as other viable semiconductor technology and architecture including micro-electro-mechanical (MEM) systems.

Applications that may include the novel apparatus and systems of various embodiments include electronic circuitry used in high-speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.) and others. Some embodiments may include a number of methods.

The examples set forth above are provided to give those of ordinary skill in the art a complete disclosure and description of how to make and use the embodiments of the present disclosure, and are not intended to limit the scope of what the inventors regard as their disclosure. Modifications of the above described modes for carrying out the disclosure may be used by persons of skill in the art, and are intended to be within the scope of the following claims. All patents and publications mentioned in the specification may be indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications may be made without departing from the spirit and scope of the present disclosure. Accordingly, other embodiments are within the scope of the following claims.

The invention claimed is:

1. A monolithically integrated switch configured to operate at an input signal frequency ranging from 0 Hz to 80 GHz, the switch comprising:
   an input port configured to carry the input signal;
   a plurality of switches configured to provide a plurality of conduction paths;
   a first output port and a second output port;
   a first conduction path of the plurality of conduction paths between the input port and the first output port, the first conduction path comprising a first attenuator block comprising one or more shunting resistors and one or more series connected switches of the plurality of switches;
   a second conduction path of the plurality of conduction paths between the input port and the second output port;
   a first shunting path of the plurality of conduction paths between the first output port and a reference potential;
   a second shunting path of the plurality of conduction paths between the second output port and the reference potential;
   wherein:
   a low impedance or high impedance of a conduction path of the plurality of conduction paths is selectively provided by one or more switches of the plurality of switches based on a mode of operation of the switch;
   during a first mode of operation of the switch, the first conduction path and the second shunting path are low impedance conduction paths, and the second conduction path and the first shunting path are high impedance conduction paths,
   during a second mode of operation of the switch, the second conduction path and the first shunting path are low impedance conduction paths, and the first conduction path and the second shunting path are high impedance conduction paths, and
   during the first mode of operation, the first attenuator block is configured to reduce a magnitude of voltage standing wave reflections (VSWR) based on a value of a load impedance coupled to the first output port.

2. The monolithically integrated switch of claim 1, wherein the second conduction path further comprises a second attenuator block comprising one or more shunting resistors and one or more series connected switches of the plurality of switches, the second attenuator block being configured, during the second mode of operation, to reduce a magnitude of voltage standing wave reflections based on a value of a load impedance coupled to the second output port.

3. The monolithically integrated switch of claim 1 or claim 2, wherein the attenuator block is an embedded Pi-attenuator, comprising:
   a switch to provide a conduction path; and
   two shunting resistors connected, via a first terminal of the resistors, to two opposite sides of the conduction path, and connected, via a second terminal of the resistors, to the reference potential.

4. The monolithically integrated switch of claim 1 or claim 2, wherein the attenuator block is an embedded T-attenuator, comprising:
   two series connected switches to provide a conduction path; and
   a shunting resistor connected, via a first terminal of the resistor, to a common node of the two series connected switches, and connected, via a second terminal of the resistor, to the reference potential.

5. The monolithically integrated switch of claim 1 or claim 2, wherein the attenuator block is an embedded L-attenuator, comprising:
   a switch to provide a conduction path; and
   a shunting resistor connected, via a first terminal of the resistor, to one side of the conduction path closest to the input port, and connected, via a second terminal of the resistor, to the reference potential.

6. The monolithically integrated switch of claim 1 or claim 2, wherein resistance values of the one or more shunting resistors of the first attenuator block and/or second attenuator block are a same value resistance.

7. The monolithically integrated switch of claim 6, wherein the same value resistance is calculated to provide a VSWR magnitude of 1 based on the value of the load impedance and a value of an ON resistance of the one or more series connected switches.

8. The monolithically integrated switch of claim 1 or claim 2, wherein each of the first and the second shunting paths comprise one or more series connected switches of the plurality of the switches, a number of the one or more series connected switches being selected based on a desired voltage handling capability of the monolithically integrated switch.

9. The monolithically integrated switch of claim 8, wherein a switch of the plurality of switches is one of a) a metal-oxide field effect transistor (MOSFET), b) a metal-semiconductor field effect transistor (MESFET), c) a P-N diode, and d) a PIN diode.

10. The monolithically integrated switch of claim 9 fabricated using a technology comprising one of: a) silicon on sapphire (SOS), b) silicon on insulator (SOI), c) bulk-silicon, and d) micro-electro-mechanical systems.

11. A delay line module comprising:
    a first switch and a second switch, each of said first switch and second switch being the monolithically integrated switch of claim 2;
    a first delay module coupled between the first output port of the first switch and the first output port of the second switch; and
    a second delay module coupled between the second output port of the first switch and the second output port of the second switch.

12. The delay line module of claim 11, wherein during the first mode of operation of the first switch and the second switch, a low impedance path is provided between the input port of the first switch and the input port of the second switch through the first delay module, and during the second mode of operation of the first switch and the second switch, a low impedance path is provided between the input port of the first switch and the input port of the second switch through the second delay module.

13. The delay line module of claim 12, wherein the first delay module passes a signal with zero delay, and the second delay module passes a signal with a nominal delay.

14. A monolithically integrated switch configured to operate at an input signal frequency ranging from 0 Hz to 80 GHz, the switch comprising:
    an input port configured to carry the input signal;
    a plurality of switches configured to provide a plurality of conduction paths;
    a plurality of output ports comprising a first output port, a second output port, . . . , and an $n^{th}$ output port, n being an integer equal to or greater than three;
    a first conduction path of the plurality of conduction paths between the input port and the first output port, the first conduction path comprising a first attenuator block comprising one or more shunting resistors and one or more series connected switches of the plurality of switches;
    a second conduction path of the plurality of conduction paths between the input port and the second output port, the second conduction path comprising a second attenuator block comprising one or more shunting resistors and one or more series connected switches of the plurality of switches;
    . . . an $n^{th}$ conduction path of the plurality of conduction paths between the input port and the $n^{th}$ output port, the $n^{th}$ conduction path comprising an $n^{th}$ attenuator block comprising one or more shunting resistors and one or more series connected switches of the plurality of switches;
    a first shunting path of the plurality of conduction paths between the first output port and a reference potential;
    a second shunting path of the plurality of conduction paths between the second output port and the reference potential;
    . . . and;
    an $n^{th}$ shunting path of the plurality of conduction paths between the $n^{th}$ output port and the reference potential,
    wherein:
    a low impedance or high impedance of a conduction path of the plurality of conduction paths is selectively provided by one or more switches of the plurality of switches based on a mode i of operation of the switch, where i∈[1, 2, . . . , n],
    during the mode i of operation of the switch, the $i^{th}$ conduction path is a low impedance conduction path and all $p^{th}$ conduction paths, with p=[1, 2, . . . , i−1, i+1, . . . , n], are high impedance conduction paths,
    during the mode i of operation of the switch, the $i^{th}$ shunting path is a high impedance conduction path and all $p^{th}$ shunting paths, with p=[1, 2, . . . , i−1, i+1, . . . , n], are low impedance conduction paths, and
    during the mode i of operation, the $i^{th}$ attenuator block is configured to reduce a magnitude of voltage standing wave reflections (VSWR) based on a value of a load impedance coupled to the $i^{th}$ output port.

15. The monolithically integrated switch of claim 14, wherein an attenuator block of the first, second, . . . , $n^{th}$ attenuator block comprises one of: a) an embedded Pi-attenuator, b) an embedded T-attenuator, and c) an embedded L-attenuator.

16. The monolithically integrated switch of claim 14, wherein each of the first, the second, . . . , and the $n^{th}$ shunting paths comprise one or more series connected switches of the plurality of switches, a number of the one or more series connected switches being selected based on a desired voltage handling capability of the monolithically integrated switch.

17. The monolithically integrated switch of claim 14, wherein a switch of the plurality of switches is one of: a) a metal-oxide field effect transistor (MOSFET), b) a metal-semiconductor field effect transistor (MESFET), c) a P-N diode, and d) a PIN diode.

18. The monolithically integrated switch of claim 17 fabricated using a technology comprising one of: a) silicon on sapphire (SOS), b) silicon on insulator (SOI), c) bulk-silicon, and d) micro-electro-mechanical systems.

19. A delay line module comprising:
(i) a first switch and a second switch, the first switch and the second switch being the monolithically integrated switch of claim 14; and
(ii) a plurality of delay modules comprising:
a first delay module coupled between the first output port of the first switch and the first output port of the second switch;
a second delay module coupled between the second output port of the first switch and the second output port of the second switch;
. . . and;
an $n^{th}$ delay module coupled between the $n^{th}$ output port of the first switch and the $n^{th}$ output port of the second switch.

20. The delay line module of claim 19, wherein during the mode i of operation of the first switch and the second switch, a low impedance path is provided between the input port of the first switch and the input port of the second switch through the $i^{th}$ delay module.

21. The delay line module of claim 20, wherein the first delay module passes a signal with zero delay.

22. The delay line module of claim 20, wherein one or more delay modules of the first, second, . . . , $n^{th}$ delay module pass a signal with a nominal delay.

23. The delay line module of claim 22, wherein a nominal delay of an $i^{th}$ delay module of the one or more delay modules is different from a nominal delay of a $p^{th}$ delay module of the one or more delay modules, wherein i is different from p.

24. The delay line module of claim 23, wherein the nominal delay of the $i^{th}$ delay module is equal to $x^{i-1}*\Delta t$, and the nominal delay of the $p^{th}$ delay module is equal to $x^{p-1}*\Delta t$, where $\Delta t$ is a fixed non zero delay and x is a non-zero number.

25. A switched delay line module comprising a plurality of series connected delay line modules according to claim 11 or claim 19.

26. The switched delay line module of claim 25 monolithically integrated on a same integrated circuit.

27. The switched delay line module of claim 26 fabricated using a technology comprising one of: a) silicon on sapphire (SOS), b) silicon on insulator (SOI), c) bulk-silicon, and d) micro-electro-mechanical systems.

28. A method for reducing input return loss in a monolithically integrated single pole double throw (SPDT) switch operating at an input signal frequency ranging from 0 Hz to 80 GHz, the method comprising:
providing in a conduction path between a pole terminal and a first throw terminal of the SPDT integrated switch an attenuator block comprising one or more switches and one or more shunting resistors;
based on the providing, selecting a resistance value of the one or more shunting resistors based on an ON resistance of the one or more switches and a desired load impedance at the first throw terminal;
based on the selecting, decreasing a series resistance seen at the first throw terminal; and
based on the decreasing, reducing the input return loss and thereby reducing a corresponding voltage standing wave reflections (VSWR) at the first throw terminal.

29. The method of claim 28, further comprising fabricating the monolithically integrated SPDT switch using a technology comprising one of: a) silicon on sapphire (SOS), b) silicon on insulator (SOI), c) bulk-silicon, and d) micro-electro-mechanical systems.

30. A method for increasing delay accuracy in a switched delay line module, the method comprising:
providing a first single pole multiple throw (SPMT) switch and a second SPMT switch;
coupling a first throw terminal of the first SPMT to a first throw terminal of the second SPMT switch via a first delay module;
providing, in a conduction path between a pole terminal of the first SPMT switch and the first throw terminal of the first SPMT switch, a first attenuator block comprising one or more switches and one or more shunting resistors;
providing, in a conduction path between a pole terminal of the second SPMT switch and the first throw terminal of the second SPMT switch, a second attenuator block comprising one or more switches and one or more shunting resistors;
selecting, for the first attenuator block, a resistance value of the one or more shunting resistors based on an ON resistance of the one or more switches and a load impedance of the first delay module at the first throw terminal of the first SPMT;
selecting, for the second attenuator block, a resistance value of the one or more shunting resistors based on an ON resistance of the one or more switches and a load impedance of the first delay module at the first throw terminal of the second SPMT switch;
based on the selecting for the first and the second attenuator blocks, reduce a linear phase shift of a signal transmitted from the pole terminal of the first SPMT switch to the pole terminal of the second SPMT switch through the first throw terminal of the first SPMT switch, the first delay module and the first throw terminal of the second SPMT switch; and
based on the reducing, increasing delay accuracy provided by a conduction path associated to the first delay module of the switched delay line module.

31. The method of claim 30, further comprising:
coupling, in a one to one relationship, each throw terminal of the first SPMT switch different from the first throw terminal, to a corresponding throw terminal of the second SPMT switch different from the first throw terminal, via a delay line, thereby obtaining conduction paths associated to each pair of throw terminals, each conduction path comprising the each pair of throw terminals, a delay line and the pole terminals of the first and second SPMT switches;
providing in each of the conduction paths associated to each pair of throw terminals, an attenuator block between the pole terminal of the first SPMT switch and an associated throw terminal of the first SPMT switch, the attenuator block comprising one or more switches and one or more shunting resistors;

providing in each of the conduction paths associated to each pair of throw terminals, an attenuator block in a conduction patch between the pole terminal of the second SPMT switch and an associated throw terminal of the second SPMT switch, the attenuator block comprising one or more switches and one or more shunting resistors;

selecting, for each of the attenuator blocks, a resistance value of the one or more shunting resistors based on an ON resistance of the one or more switches and a load impedance of the delay module at an associated throw terminal of the first/second SPMT switch; and based on the selecting, reducing a linear phase shift of a signal transmitted through the conduction paths associated to each pair of throw terminals, thereby increasing delay accuracy provided by the conduction paths.

32. A monolithically integrated switch configured to operate at an input signal frequency ranging from 0 Hz to 80 GHz, the switch comprising:
(i) an input port configured to carry the input signal;
(ii) a first output port and a second output port;
(iii) a first conduction path between the input port and the first output port, comprising:
  a first group of one or more series connected switches coupled between the input port and the first output port;
  a first group of one or more shunting resistors coupled between the first group of one or more series connected switches and ground; and
  a second group of one or more series connected switches coupled between the first output port and ground; and
(iv) a second conduction path between the input port and the second output port, comprising:
  a third group of one or more series connected switches coupled between the input port and the second output port;
  a second group of one or more shunting resistors coupled between the third group of one or more series connected switches and ground; and
  a fourth group of one or more series connected switches coupled between the first second output port and ground.

33. The monolithically integrated switch of claim 32, further comprising:
a first mode of operation wherein:
  the first group of one or more series connected switches are ON;
  the second group of one or more series connected switches are OFF;
  the third group of one or more series connected switches are OFF; and
  the fourth group of one or more series connected switches are ON; and
a second mode of operation wherein:
  the first group of one or more series connected switches are OFF;
  the second group of one or more series connected switches are ON;
  the third group of one or more series connected switches are ON; and
  the fourth group of one or more series connected switches are OFF.

34. The monolithically integrated switch of claim 32, wherein the first group of one or more series connected switches comprises two series connected switches, and the first group of one or more shunting resistors comprises one shunting resistor connected to a common node of the two series connected switches.

35. The monolithically integrated switch of claim 32, wherein the first group of one or more series connected switches comprises one switch, and the first group of one or more shunting resistors comprises two shunting resistors respectively connected to a common node of the one switch and the input port and to a common node of the one switch and the first output port.

* * * * *